(12) United States Patent
Reagan et al.

(10) Patent No.: US 10,737,933 B2
(45) Date of Patent: Aug. 11, 2020

(54) FLUSH-MOUNT MICROMACHINED TRANSDUCERS

(71) Applicant: University of Florida Research Foundation, Incorporated, Gainesville, FL (US)

(72) Inventors: Tiffany N. Reagan, Gainesville, FL (US); Mark Sheplak, Gainesville, FL (US); Dylan P. Alexander, Gainesville, FL (US)

(73) Assignee: University of Florida Research Foundation, Incorporated, Gainesville, FL (US)

( * ) Notice: Subject to any disclaimer, the term of this patent is extended or adjusted under 35 U.S.C. 154(b) by 0 days.

(21) Appl. No.: 16/084,706

(22) PCT Filed: Mar. 28, 2017

(86) PCT No.: PCT/US2017/024551
§ 371 (c)(1),
(2) Date: Sep. 13, 2018

(87) PCT Pub. No.: WO2017/176506
PCT Pub. Date: Oct. 12, 2017

(65) Prior Publication Data
US 2019/0077654 A1 Mar. 14, 2019

Related U.S. Application Data

(60) Provisional application No. 62/318,298, filed on Apr. 5, 2016.

(51) Int. Cl.
*B81B 7/00* (2006.01)
*H04R 19/04* (2006.01)
*H04R 3/00* (2006.01)
*B81B 7/02* (2006.01)
*B81C 1/00* (2006.01)
(Continued)

(52) U.S. Cl.
CPC ............ *B81B 7/007* (2013.01); *B81B 7/0006* (2013.01); *B81B 7/02* (2013.01); *B81C 1/00301* (2013.01);
(Continued)

(58) Field of Classification Search
CPC ......... B81B 7/007; B81B 7/02; B81B 7/0006; B81B 2207/096; B81B 2201/0264;
(Continued)

(56) References Cited

U.S. PATENT DOCUMENTS 5,640,306 A * 6/1997 Gaumet ........... G06K 19/07749
174/528
6,420,201 B1 7/2002 Webster
(Continued)

OTHER PUBLICATIONS

International Searching Authority, International Search Report for Application No. PCT/US2017/024551, dated Jun. 28, 2017, 3 pages, Korean Intellectual Property Office, Republic of Korea.
(Continued)

*Primary Examiner* — Yasser A Abdelaziez
(74) *Attorney, Agent, or Firm* — Alston & Bird LLP

(57) ABSTRACT

Flush mount sensor packages and packaging methods for micromachined transducers, which can be used for fluid flow measurements, are provided. A sensor package can include a substrate, a sensor mounted on a front side of the substrate, a wire bond coupled to the sensor and passing through the substrate, and a shim cap positioned around the sensor. The wire bond does not protrude above the topside of the sensor, and the shim cap and the sensor can be substantially flush.

11 Claims, 17 Drawing Sheets

(51) Int. Cl.
*H04R 19/00* (2006.01)
*H04R 17/02* (2006.01)

(52) U.S. Cl.
CPC .............. *H04R 3/005* (2013.01); *H04R 19/04* (2013.01); *B81B 2201/0257* (2013.01); *B81B 2201/0264* (2013.01); *B81B 2207/096* (2013.01); *H04R 17/02* (2013.01); *H04R 19/005* (2013.01); *H04R 2201/003* (2013.01); *H04R 2499/13* (2013.01)

(58) Field of Classification Search
CPC ....................... B81B 2201/0257; H04R 3/005; H04R 19/04; H04R 17/02; H04R 2201/003; H04R 2499/13; H04R 19/005; B81C 1/00301
See application file for complete search history.

(56) References Cited

U.S. PATENT DOCUMENTS

| | | | |
|---|---|---|---|
| 6,566,745 B1 | 5/2003 | Beyne et al. | |
| 6,870,938 B2* | 3/2005 | Takeuchi | H04R 1/04 381/113 |
| 7,200,930 B2* | 4/2007 | Khandros | B23K 20/004 29/860 |
| 2010/0072562 A1* | 3/2010 | Sato | B81C 1/00301 257/415 |
| 2010/0117224 A1 | 5/2010 | Mcelrea et al. | |
| 2011/0203378 A1* | 8/2011 | Buccafusca | G01H 9/00 73/655 |
| 2011/0254108 A1 | 10/2011 | Gozzini et al. | |
| 2011/0274299 A1* | 11/2011 | Shaw | B81B 7/0064 381/174 |
| 2013/0336511 A1* | 12/2013 | Underbrink | B81B 7/0006 381/369 |
| 2017/0113924 A1* | 4/2017 | Pahl | H01L 24/73 |

OTHER PUBLICATIONS

Williams et al., "An AlN MEMS Piezoelectric Microphone for Aeroacoustic Applications," *Journal of Microelectromechanical Systems*, vol. 21, No. 2, 2012, pp. 270-283.

* cited by examiner

FLUSH-MOUNT MICROMACHINED TRANSDUCERS

CROSS REFERENCE TO RELATED APPLICATION

This application is a national stage application, filed under 35 U.S.C. § 371, of International Application No. PCT/US2017/024551, filed Mar. 28, 2017, which claims the benefit of U.S. Provisional Patent Application Ser. No. 62/318,298, filed Apr. 5, 2016, which is incorporated herein by reference in its entirety, including any figures, tables, and drawings.

STATEMENT OF GOVERNMENT SUPPORT

This invention was made with government support under Grant No. 1439644 awarded by the National Science Foundation. The government has certain rights in the invention.

BACKGROUND

Commercial aircraft manufacturers are continuously trying to reduce the amount of noise that aircrafts produce for a multitude of reasons. Major contributors include shockcell noise, buzzsaw noise, boundary layer noise, and other flow-induced noise such as that caused by airflow over the pilot windshield, cavities (e.g., wheel wells), or due to seal issues on doors, wing to body joints, or flap seals. Extended periods of exposure to aircraft noise is a recognized form of air pollution, causing health concerns to humans and animals in areas around airports. In addition, noise is a concern for passengers and flight crews, which experience long-term exposure to in-flight noise. There are even regulations that limit the effective perceived noise level (EPNL) that an aircraft can emit.

Microphones are essential tools used by aeroacousticians to locate, understand and mitigate the impact of noise sources on aircrafts. Such microphones, especially those used for in-flight measurements, can be subject to extreme conditions including high pressures, large changes in temperature, and moisture. Dynamic pressure arrays require small sensing elements, high bandwidth, and close spacing in order to adequately resolve the time and length scales of interest in flow, while aeroacoustic phased arrays require large channel counts to be effective. In terms of performance, these sensors must be able to sense large sound pressure levels without distorting, possess a moderate noise floor, and the sensitivity must be known precisely within a set bandwidth.

Due to the demanding conditions in which aircraft microphones must perform, and their high performance requirements, their costs can be high and the associated costs can hinder the ability to obtain needed measurements. Even with their high cost, commercial sensors are still often constrained by the quality and type of measurements they can obtain. In designing a sensor, additional factors that need to be taken into account include the size of the sensor, the sensor package, and external power and signal conditioning requirements.

BRIEF SUMMARY

Embodiments of the present invention include sensor packages and methods of fabrication thereof. As a specific example, embodiments of the present invention can be utilized in the aviation industry. Due to the problems discussed above, there is a need in the art for a robust, low-cost, thin, high-performance alternative to the currently available instrumentation grade sensors and sensor packages. Microelectromechanical systems (MEMS) microphones, exhibiting high performance, reduced size, and the ability to be manufactured using low cost batch fabrication technology, can be incorporated into some embodiments of the subject invention as a solution to this problem. According to embodiments, backside connections, including through silicon vias (TSVs) can be incorporated into sensor package design. Connection to the substrate can be improved in terms of reliability, repeatability, and resolution of the number of connections that may be made to the backside of the sensor. Overall flushness can be improved, for example, by using an epoxy film, whereby a shim cap can sit on top of the epoxy film, and the applied pressure to the shim cap and sensor during attachment can allow the epoxy to flow around the sensor.

Sensor packages according to embodiments of the present invention can include a decoupling of the electrical and mechanical connections between the sensor and the substrate of the package. This can advantageously result in a "soft" connection between the sensor and substrate, leading to better thermal and mechanical performance of the sensor provided in the sensor package during use. Such a decoupling of the electrical and mechanical connections can be accomplished by, for example using a wire bond passing through the substrate and connecting to the sensor (e.g., to a backside of the sensor). A protective encapsulant, though not necessary, can also be provided on the backside of the sensor (e.g., between the sensor and the substrate).

Sensor packages of embodiments of the present invention can be used with any suitable type of sensor, including but not limited to acoustic sensors (e.g., microphones such as MEMS microphones), shear stress sensors, pressure sensors, and dynamic pressure sensors. The sensor packages described herein are particularly advantageous for a sensor having a flat, approximately flat, or mostly flat upper surface that would be exposed at an upper portion of the package in use. Such sensor packages allow for the sensor package including the sensor to be flush or flat (or mostly flat) along the top of the package.

A sensor package according to an embodiment of the present invention can include a substrate, a sensor mounted on a front side of the substrate, a wire bond coupled to the sensor and passing through the substrate, and a shim cap positioned around the sensor, wherein the wire bond remains beneath the topside of the sensor package.

A sensor package according to another embodiment can include a substrate having a pocket formed on a front side of the substrate, a sensor mounted in the pocket of the substrate, and a means for electrically coupling the sensor to the back or sides of the substrate without protruding above a topside of the sensor or a topside of the substrate. In addition, the top of the sensor and the sides of the substrate can be completely flush or substantially flush.

A method of fabricating a sensor package according to an embodiment of the present invention can include providing a substrate having at least one hole, attaching a sensor to a front side of the substrate, and coupling a wire bond to the sensor and passing it through the hole such that the wire bond does not protrude above a top surface of the sensor package.

Experiments were conducted to prove the concepts of the present invention. A flush-mount piezoelectric microphone prototype including packaging was produced. TSVs were formulated into the fabrication to eliminate the use of front side wire bonds. The packaged sensor demonstrated an overall flushness to within 6 µm. Experimental characterization shows a comparable sensitivity (10.3 µV/Pa) and noise floor (44.6 dB) with a significantly higher resonant frequency (187 kHz) than the prior art.

DETAILED DESCRIPTION

Figure 1:
FIG. 1 is an image of a dynamic pressure array on an airplane fuselage.

New sensor technologies are needed to overcome the above-mentioned problems. Currently there is no commercially available sensor system that is affordable to the consumer and provides the measurement resolution needed, particularly when interested in purchasing large quantities of sensor systems where the cost can become prohibitive. An embodiment of the present invention uses sensor package microfabrication for a significant reduction in the cost of the sensor system, and this packaging method allows the sensors to meet high end performance requirements and specifications. The thinner sensor sits closer to the surface allowing for better measurements. Its thinner size also allows for a smaller package and, as a result, can be more densely packed to achieve higher resolution of the mapped pressure field. Additionally, the construction, design and robustness of the sensor package embodiments allow the diaphragm to be part of the sensing side of the device and prevent the need for a screen or cavity in front of the diaphragm.

Fabrication costs become much less expensive with batch fabrication technology, and subsequently the cost per channel becomes a less restrictive component on the array channel count. Embodiments of the present invention can not only reduce the up-front costs of an array, but also reduce the recurring costs of array upkeep. Having a low cost, embodiments of the present invention can reduce the amount of effort and protective measures when handling and removing the sensors. The labor to recover sensors intact and refurbish them as needed for redeployment may far exceed the cost of the sensor. While a high quality installation is still necessary, if the de-installation process can be reduced to stripping sensors off and throwing them away, it could result in significant savings. Made inexpensive enough, sensors according to an embodiment of the present invention can be viewed as disposable, and a higher channel count can be achieved.

Embodiments of the subject invention provide novel and advantageous sensors, sensor packages, and sensor package fabrication methods. The sensor packages of embodiments of the present invention can include micromachined transducers for applications that require high spatial resolution measurements, such as turbulence, and require a hydraulically smooth front surface in order to accurately capture the flow environment. Sensors that can be applied to embodiments of the present invention include all types of fluid flow measurement sensors, such as dynamic pressure sensors, microphones, and shear stress sensors. Examples of the four major transduction mechanisms for sensors (e.g., microfabricated microphones) that can be applied to the embodiments of the present invention include optical, capacitive, piezoresistive, and piezoelectric. When compared to the other transduction mechanisms, the piezoelectric transduction scheme is robust, specifically with respect to moisture, which is an issue with capacitive transduction. Since it is passive, only sensor interface circuits need to be powered, and the overall sensor has low power consumption (neither capacitive nor piezoresistive is a passive transduction mechanism). This enables the use of compact data systems with standard integrated 4 mA constant-current sources. However, a multitude of different types of sensors could be applied and the present invention is not intended to be in any way limited to the piezoelectric transduction scheme.

Sensor packages according to embodiments of the present invention can include a decoupling of the electrical and mechanical connections between the sensor and the substrate of the package. This can advantageously result in a "soft" connection between the sensor and substrate, leading to better thermal and mechanical performance of the sensor provided in the sensor package during use. Such a decoupling of the electrical and mechanical connections can be accomplished by, for example using a wire bond passing through the substrate and connecting to the sensor (e.g., to a backside of the sensor). A protective encapsulant, though not necessary, can also be provided on the backside of the sensor (e.g., between the sensor and the substrate).

Sensor packages of embodiments of the present invention can be used with any suitable type of sensor, including but not limited to acoustic sensors (e.g., microphones such as MEMS microphones), shear stress sensors, pressure sensors, and dynamic pressure sensors. The sensor packages described herein are particularly advantageous for a sensor having a flat, approximately flat, or mostly flat upper surface that would be exposed at an upper portion of the package in use. Such sensor packages allow for the sensor package including the sensor to be flush or flat (or mostly flat) along the top of the package.

Applications for embodiments of the present invention include all types of fluid flow measurements, such as airflow over an airplane fuselage, flyover arrays, static engine arrays, air flow in a wind tunnel, and road vehicle tests. In addition, the sensor packages of embodiments of the present invention can be applied to measuring pressure changes and shear stress in other fluids, including gases other (e.g., liquids such as water).

FIG. 1 shows a potential application of an embodiment of the present invention. Specifically, FIG. 1 is an image of a dynamic pressure array on the fuselage of an airplane. The dynamic pressure array can be used to pinpoint where noise is being generated during flight so that engineers can attempt to mitigate it. Embodiments of the present invention are particularly advantageous for this application because they are low cost, able to withstand harsh conditions, have a low profile, and have a pressure sensor and pressure sensor diaphragm that are completely or substantially flush with the top of the sensor package. The pressure sensor and pressure sensor diaphragm being flush with the top of the sensor package allows for more precise measurement readings, especially in shear stress measurements.

Figure 2:
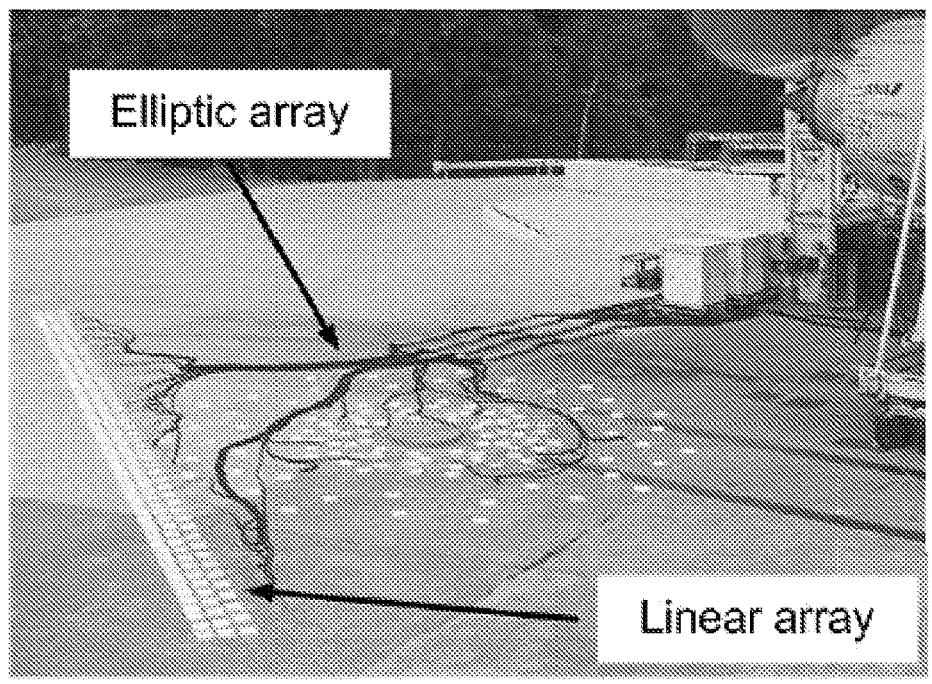
FIG. 2 is an image of a linear and an elliptic aeroacoustic array used as part of a static engine test.

FIG. 2 is another image demonstrating an application of embodiments the present invention. Specifically, FIG. 2 is an image of a linear and elliptic aeroacoustic array used as part of a static engine test. These acoustic arrays are a spatially distributed collection of microphones that are able to sample the fluctuating pressure on the surface at multiple locations. For similar reasons as stated above, including cost, durability, and precision, embodiments of the present invention would be well suited for this sort of application.

Figure 3:
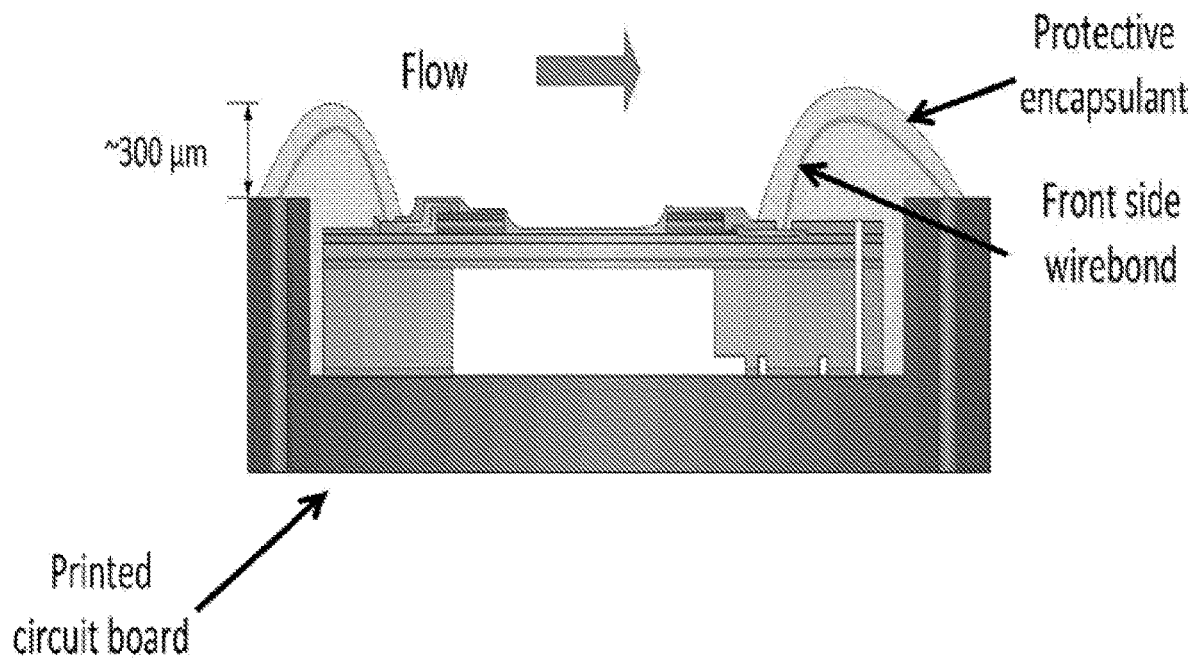
FIG. 3 is a cross-sectional view of a sensor package having front side wire bonds that protrude above the surface of the sensor and substrate.

FIG. 3 is a cross-sectional view of an example of a sensor package having front side wire bonds and a protective encapsulant that protrudes above the surface of the sensor and the printed circuit board substrate. Having front side wire bonds can reduce the ability of the sensor, which can include a sensor diaphragm, from taking accurate measurements. That is, the front side wire bonds and their protective encapsulant can dampen or block pressure waves and disrupt the fluid flow over the top of the sensor. All of these effects can result in distorted and less accurate measurements. In addition, wire bonds are often the cause of failure in sensor packages. Having wire bonds protruding beyond the front side of the sensor and the substrate (or printed circuit board) results in the wire bonds having greater exposure to the elements and fluid flow, which make them more susceptible to failure. In FIG. 3, the combination of front side wire bonds and encapsulant are approximately 300 μm in height above the top surface of the sensor package.

In order to solve many (or all) of the above-mentioned problems, a sensor package according to an embodiment of the present invention can include a substrate, a sensor mounted on a frontside of the substrate, a wire bond coupled to the sensor and passing through the substrate, and a shim cap positioned around the sensor. The wire bond can remain beneath the topside of the sensor and shim cap. There may be a requirement for electrical connections to be made on top of the sensor. However, any topside electrical connections should be minimized in height to obtain a sensor package with low surface roughness. The backside of the substrate can have a pocket where the wire bonds, protective encapsulant, amplifier, circuit components, and external connections can be located. Examples of the substrate include a printed circuit board (PCB) (e.g., a flexible printed circuit board (FPCB)) or a silicon-on-insulator wafer, though embodiments are not limited thereto. The sensor package may further include a first via coupled to the wire bond, a second via that is coupled to the first via, and an external connection suitable for connecting to external circuitry. The connection between the first via and the second via may occur on the top of the substrate, on the bottom of the substrate, or through the substrate. In addition, the sensor package may include a protective encapsulant that substantially surrounds the wire bond and an epoxy film that connects the sensor and the shim cap to the substrate. The epoxy film can be provided underneath the sensor, and holes can be provided in the epoxy film to allow access for the electrical connections to the back of the sensor. In embodiments of the present invention, a surface roughness (i.e., the deviation in height across the top surfaces of the sensor package) of less than 100 μm, less than 50 μm, less than 30 μm, and even less than 10 μm is achievable.

A sensor package according to an embodiment can include a substrate having a pocket formed on a front side of the substrate, a sensor mounted in the pocket of the substrate, and a means for electrically coupling the sensor to the back or sides of the substrate without substantially protruding above a topside of the sensor or a topside of the substrate (or does not significantly rise above the topside of the sensor package, i.e., the sensor and sides of the substrate). The means for electrically coupling the sensor to the back or sides of the substrate can include a wire bond, a via(s), or both. That is, the wire bonds and the vias have the potential to pass the through the substrate vertically or laterally (through the sides of the substrate). This can be done, for example, using one or more TSVs. The sensor can be a pressure sensor, a dynamic pressure sensor, a microphone, or a shear stress sensor.

A method of fabricating a sensor package according to an embodiment of the present invention includes providing a substrate having at least one hole, attaching a sensor to a front side of the substrate, and coupling a wire bond to the sensor and passing it through the hole such that the wire bond does not substantially protrude above a top surface of the sensor. The sensor packaging method may further include attaching a shim cap to the front side of the substrate such that the shim cap is relatively flush with the top surface of the sensor. In certain embodiments, the shim cap can be monolithically formed with (e.g., built into) the sensor itself. For example, the shim cap can comprise or be made of a material that is also present in the sensor (e.g., silicon) such that fabrication of the shim cap can be incorporated into the fabrication process of the sensor. The sensor and the shim cap can be placed on the substrate in unison using heat tape and a flip-chip bonder, which may use a vacuum to secure the shim cap and sensor. The sensor and the shim cap may be fastened to the substrate using an epoxy film, which flows around the shim cap and secures the sensor. The epoxy film may then be cured by heat, UV light, or another method. The fabricating method may further include providing one or more vias through the substrate, which are coupled to the sensor through the wire bond, and providing a protective encapsulant that covers the wire bonds. In the context of this specification and claims, "substantially flush" and "does not substantially protrude" means that the wire bonds, electrical connections, shim caps, or other elements do not significantly contribute to surface roughness. That is, for example, their contribution to surface roughness is below 30 µm, as achievable in the embodiments of the present invention.

A method of fabricating a sensor according to an embodiment includes milling out a pocket (or otherwise forming a pocket) in a substrate and placing the sensor in the pocket such that the top of the sensor and sides of the substrate are completely or substantially flush. The method may further include providing a via in the pocket of the substrate for electrically coupling the sensor to external connections on the backside of the substrate. A wire bond may be included between the via and the sensor to prevent a break in the electrical connection due to vibration or movement of the sensor, as wire bonds are more malleable than solid connections and can better withstand vibrations and movement without breaking. A protective encapsulant can be provided to protect the wire bonds and an epoxy film or another method can be used to seat the sensor in the pocket of the substrate. The fabrication method may also include providing additional vias and/or external connection pads.

Sensor packages of embodiments of the present invention include microsensors that are intended to be nonintrusive to the measurement environment by incorporating backside electrical connections, such as wire bonds and vias. In some embodiments, lateral electrical connections (not shown) including vias or wire bonds may be used instead of the backside electrical connections, while still maintaining a low surface roughness across the top of the sensor package (e.g., less than 100 µm, less than 50 µm, less than 30 µm, or less than 10 µm). Sensor packages and fabrication methods of embodiments of the present invention allow the sensor surface to be a direct part of the exposed side of the body of which the measurement is desired. The resulting package surface roughness measurements that can be achieved can be 100 micrometers or less, 50 micrometers or less, 30 micrometers or less, and even 10 micrometers or less. The low surface roughness minimizes the impact of the sensor on the environment and alteration of the measurements. The sensor can be microfabricated on a substrate, such as a silicon-on-insulator wafer that incorporates TSVs. Having backside or lateral electrical connections (not shown) allow the output of the sensing element on the front side of the device to have a path to the back or lateral sides where connections to the external circuitry can be made. The substrate may have a pocket milled into the backside and through holes drilled through the substrate to connect wire bonds to the sensor once the sensor is mounted on the substrate. The pocket may also allow for a smooth backside, ensuring flexibility for any measurement setup.

Although most embodiments of the present invention are described as having the wire bonds located beneath the surface of the sensor and the shim cap, or the sensor and the sides of the substrate, or the sensor package, there may be electrical connections that need to be made on the top of the sensor package. However, whatever electrical connections may need to be made on the topside of the sensor package do not significantly affect its surface roughness. An example of such topside electrical connections can be seen in FIG. 4.

Figure 4:
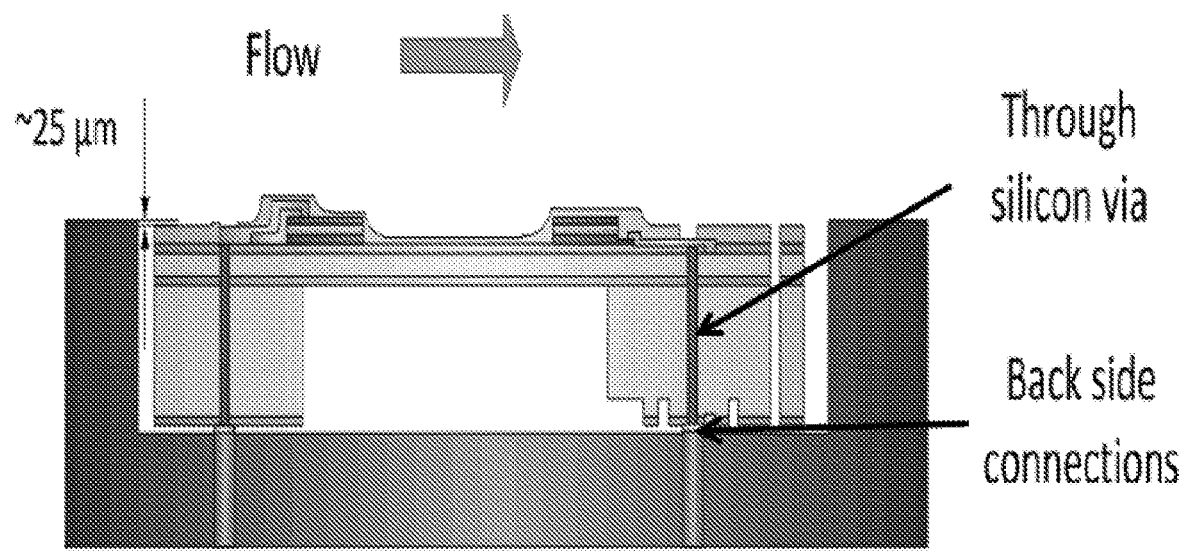
FIG. 4 is a cross-sectional view of an embodiment of the present invention wherein the substrate has a milled out pocket in which the sensor is placed.

FIG. 4 is a cross-sectional view of an embodiment of the present invention wherein the substrate has a milled out pocket in which the sensor is placed. Vias or wire bonds pass through the sensor to make backside connections with the substrate, where additional vias are provided that can complete an electrical connection to the backside of the substrate. External connections can be provided on the back side of the substrate to complete the connection to external circuitry. In addition, a vent for the diaphragm of the sensor can be included on a side (right-hand side as depicted in FIG. 4) of the substrate. The vent allows the pressure to equilibrate between the inside of the diaphragm and the outside atmosphere. Another option can be to remove the vent and have the sensor be hermetically sealed.

Figure 5A:
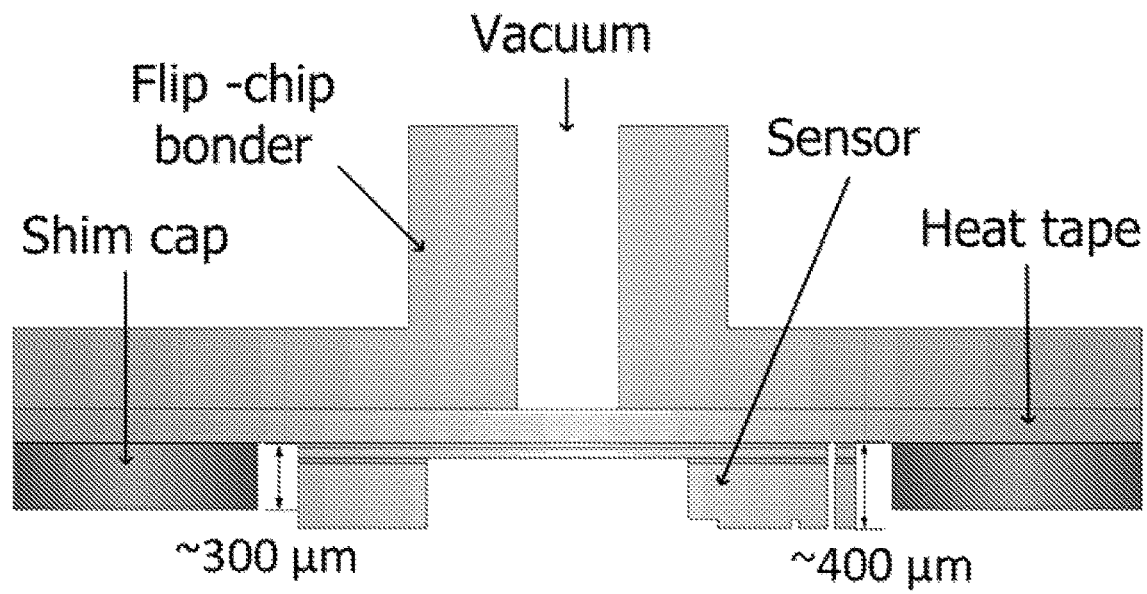
FIG. 5A illustrates a cross-sectional view of a fabrication step of placing a sensor and shim cap, according to an embodiment of the present invention.
Figure 5B:
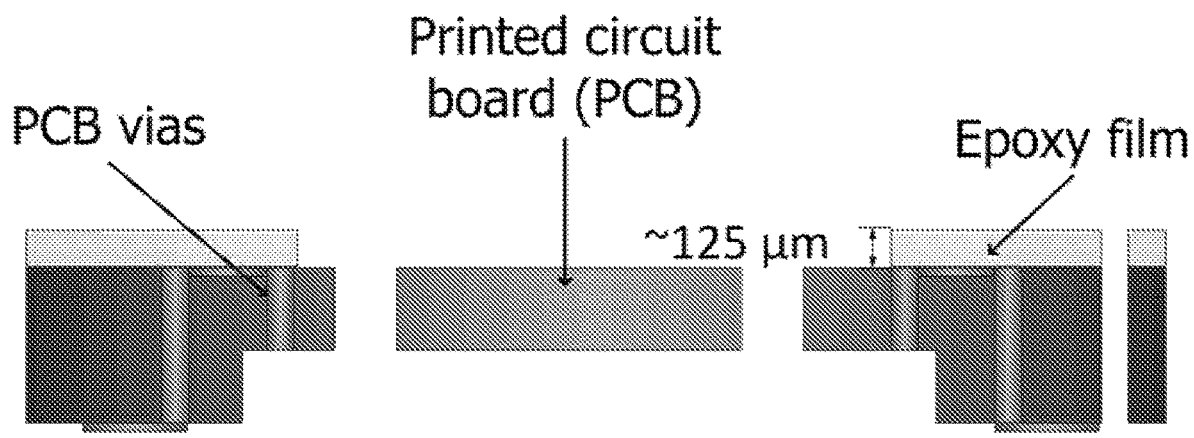
FIG. 5B illustrates a cross-sectional view of a fabrication step of providing a substrate with vias and a layer of epoxy film, which is to be received by the sensor and shim cap of FIG. 5A, according to an embodiment of the present invention.

FIGS. 5A and 5B are cross-sectional views illustrating fabrication steps according to an embodiment of the subject invention. Referring to FIG. 5A, a flip chip bonder can be used to hold the sensor and the shim cap in place. The flip chip bonder may be assisted by the help of a vacuum and/or heat tape. The heat tape may be used to hold the shim cap in place and maintain proper spacing between the shim cap and the sensor. The sensor depicted in FIG. 5A also includes a diaphragm and a vent that is located on the right-hand side of the sensor.

FIG. 5B illustrates a fabrication step of providing a substrate with vias, external connections, and a layer of epoxy film, which is to be received by the sensor and shim cap shown in FIG. 5A, according to an embodiment of the present invention.

Figure 5C:
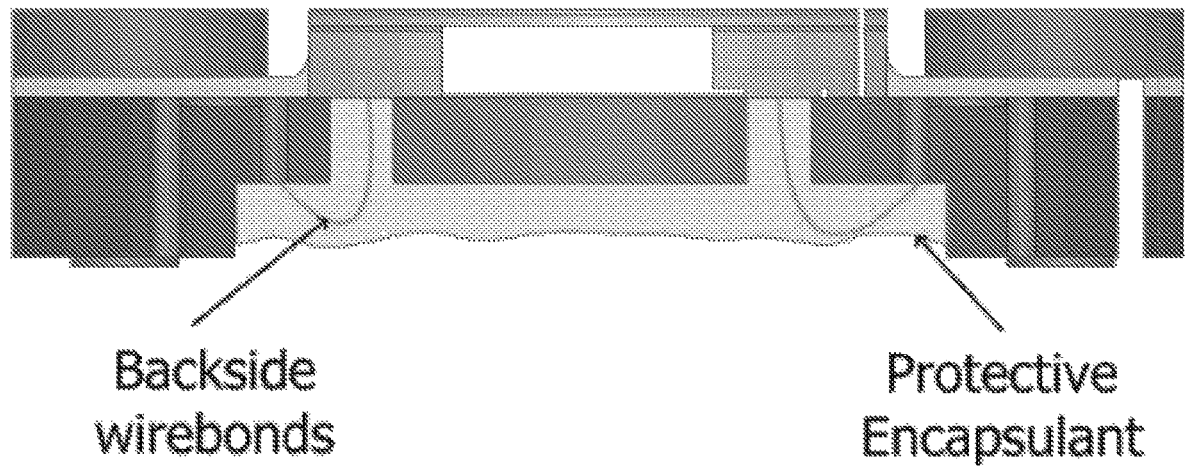
FIG. 5C is a cross-sectional view of an embodiment of the present invention.

FIG. 5C is a cross-sectional view of an embodiment of the present invention, which can be formed by the fabrication steps shown in FIGS. 5A and 5B. For example, after the shim cap and the sensor are placed and secured by the epoxy film on the lower substrate, the heat tape can be removed and the shim cap and sensor can maintain their proper positioning. Backside wire bonds can be attached from the sensor to the first inner via, which is connected to the second via on the topside of the substrate. The second via then continues the electrical connection to the bottom side of the substrate, where an external connection (or pad) is provided for connection to external circuitry.

Figure 6A:
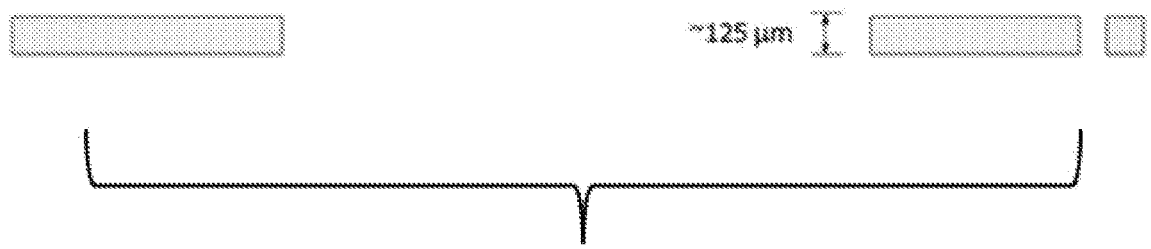
FIGS. 6A to 6F are cross-sectional views of detailed fabrication steps for forming a sensor package according to an embodiment of the present invention.
Figure 6B:
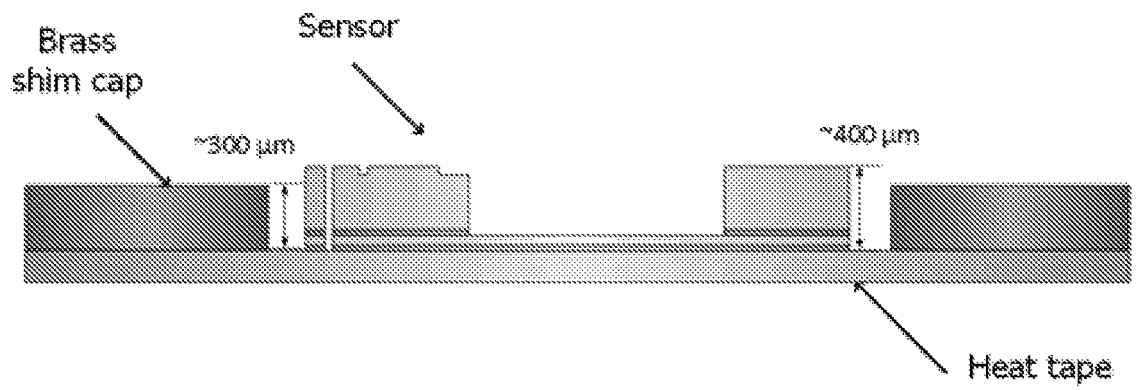
Figure 6C:

FIGS. 6A to 6F are cross-sectional views of fabrication steps for forming a sensor package according to an embodiment of the present invention. FIG. 6A shows laser cut epoxy preforms that can be used to couple the shim cap and the sensor to the substrate. In an embodiment, the epoxy film has a thickness of approximately 125 µm. FIG. 6B shows a shim cap that is provided around a sensor. The shim cap can be made of multiple materials, non-limiting examples of which include brass, plastics, silicon, and metals. In an embodiment, the approximate height of the shim cap is 300 µm and the approximate height of the sensor is 400 µm. The sensor and the shim cap can be placed on a piece of heat tape to later be transferred onto the substrate. FIG. 6C shows a substrate including two pairs of TSVs, which are connected on top of the substrate, and the placement of the layer of epoxy film on its top surface. The bottom of the substrate is also milled out to form a pocket where wire bonds, protective encapsulant, an amplifier, and circuits can later be placed.

Figure 6D:
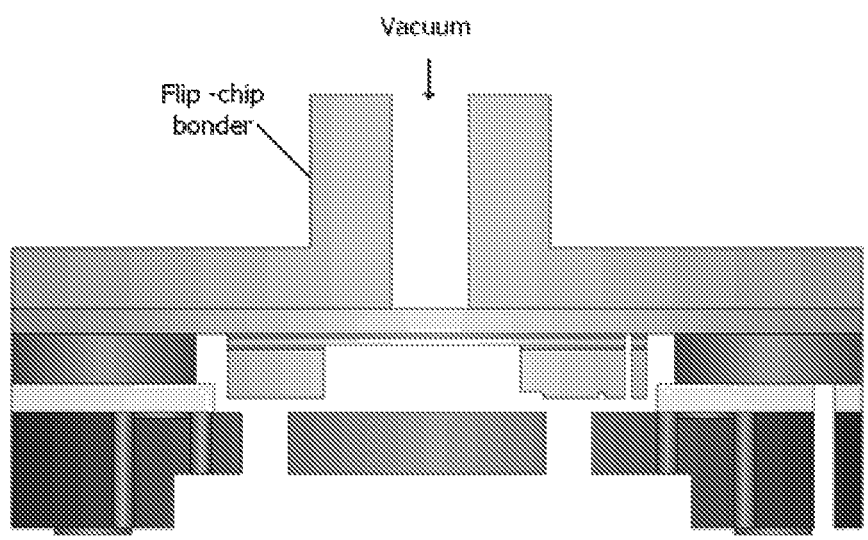
Figure 6E:
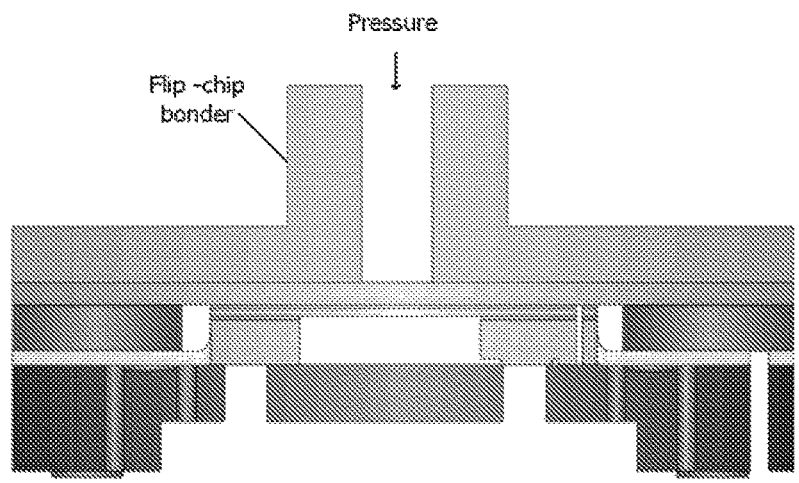
Figure 6F:
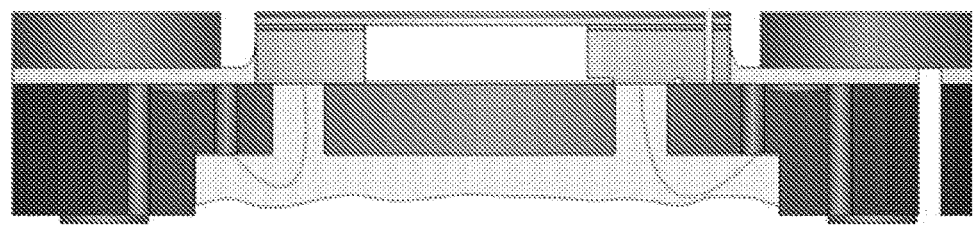

FIG. 6D shows a flip chip bonder that pulls a vacuum on the heat tape, which is attached to and maintains the correct spacing between the shim cap and sensor. Using the flip chip bonder, the heat tape, the shim cap, and the sensor are placed on the laser cut epoxy film preforms and the substrate. FIG. 6E shows the step of the epoxy film flowing around the shim cap and securing the sensor in place. A heat curing step can be included to cure the epoxy film and release the heat tape. FIG. 6F shows a cross-sectional view of an embodiment of the present invention, where wire bonds have been attached to the sensor and connected to the vias. In addition, a protective encapsulant has been provided to cover and protect the wire bonds.

Figure 27:
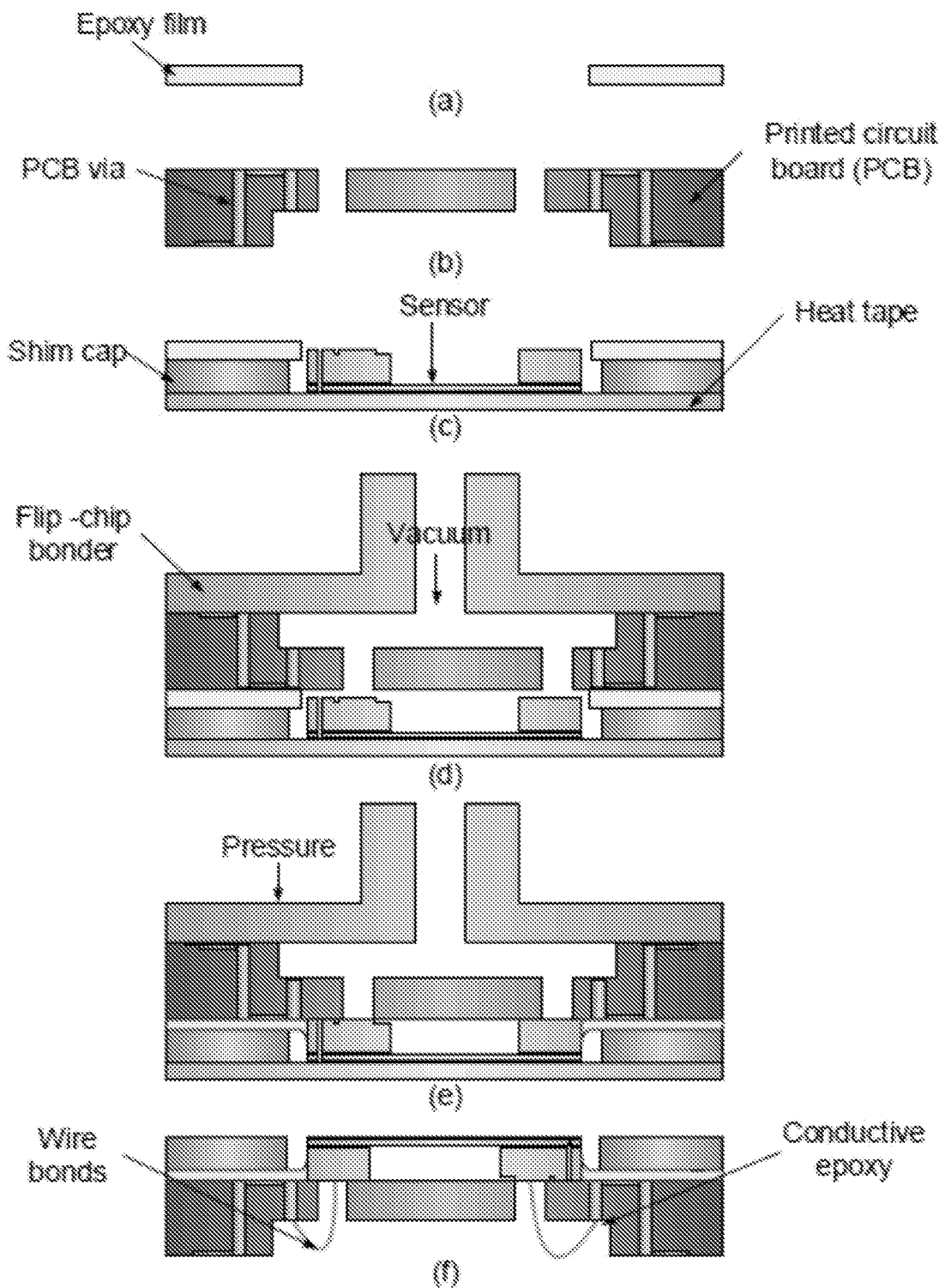
FIGS. 27A-27F are cross-sectional views of fabrication steps for forming a sensor package according to an embodiment of the present invention.

FIGS. 27A to 27F are cross-sectional views of fabrication steps for forming a sensor package according to another embodiment of the present invention. FIG. 27A shows laser cut epoxy preforms that can be used to couple the shim cap and the sensor to the substrate. FIG. 27B shows a PCB with vias that can be used as a substrate. FIG. 27C shows a shim cap that is provided around a sensor. The shim cap can be made of multiple materials, non-limiting examples of which include brass, plastics, silicon, and metals. The sensor and the shim cap can be placed on a piece of heat tape to later be transferred onto the substrate. FIG. 27D shows a flip chip bonder that pulls a vacuum on the heat tape, which is attached to and maintains the correct spacing between the shim cap and sensor. Using the flip chip bonder, the heat tape, the shim cap, and the sensor are placed on the laser cut epoxy film preforms and the substrate. FIG. 27E shows pressure being applied to the flip chip bonder to connect the substrate to the remainder of the package. FIG. 27F shows a cross-sectional view of an embodiment of the present invention, where wire bonds have been attached to the sensor and connected to the vias. A protective encapsulant (not shown) can optionally be provided to cover and protect the wire bonds.

Figure 7:
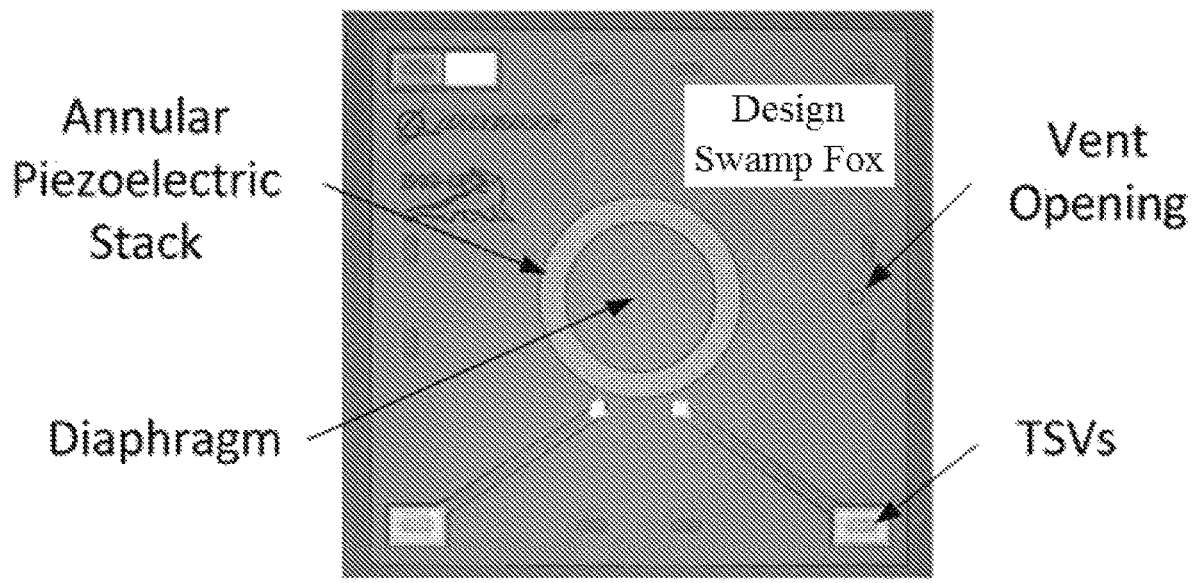
FIG. 7 is a top view of a die including a sensor according to an embodiment of the present invention.

FIG. 7 shows a top view of a die having a sensor according to an embodiment of the present invention. The center of the die includes a diaphragm for the sensor, which is surrounded by a piezoelectric stack. The diaphragm can take the shape of a circle, as shown, but other shapes are possible. The die further includes a vent and electrical connections that lead to the TSVs.

Figure 8:
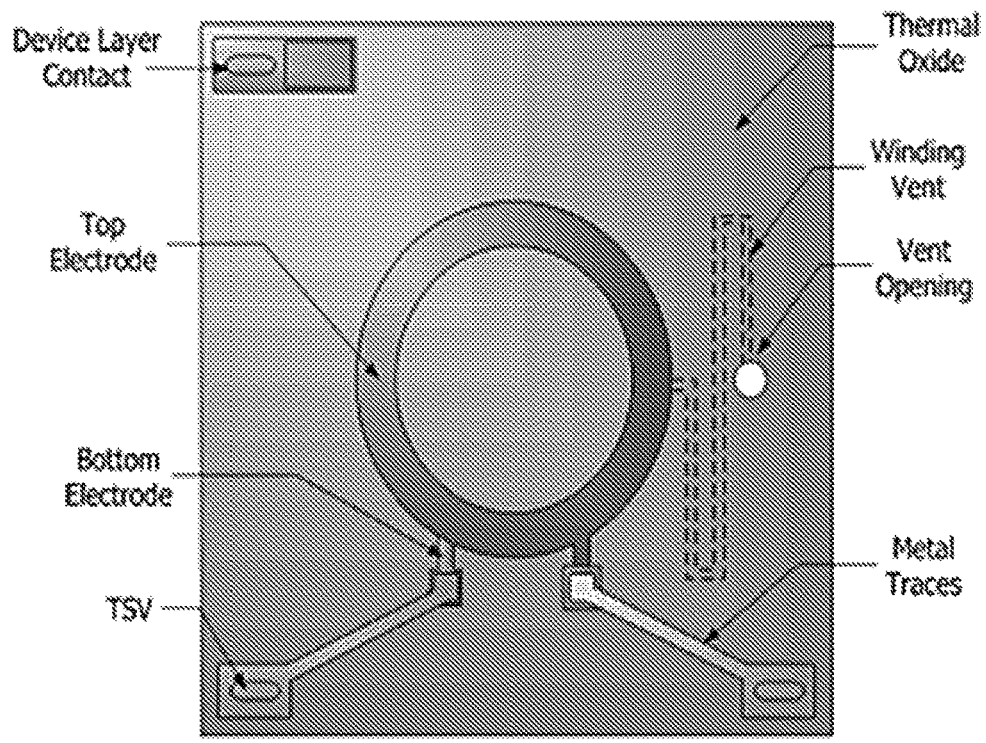
FIG. 8 is a top view of a microphone according to an embodiment of the present invention.

FIG. 8 is a top view of a microphone according to an embodiment of the present invention. Referring to FIG. 8, the device can include a winding vent and a vent opening, which allow the pressure inside the sensor to equilibrate with the outside atmosphere. The sensor (e.g., an annular piezoelectric stack) can include a top electrode and a bottom electrode. Metal traces can be used to connect the top and bottom electrode to the TSVs and a thermal oxide can be formed on the top surface of the microphone. The thermal oxide can be used to isolate the electrical paths of the conductive TSV material from the rest of the silicon substrate. The device layer contact can simple be an etch through the thermal oxide such that a connection to the underlying silicon material is made.

Figure 9:
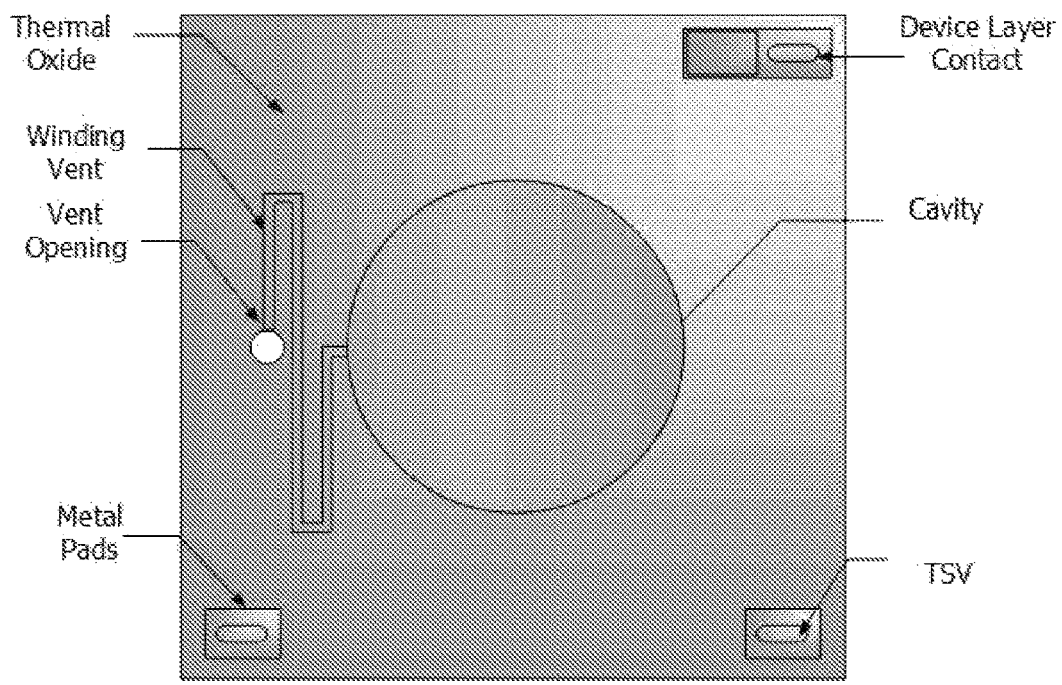
FIG. 9 is a backside view of an embodiment of the present invention.

FIG. 9 is backside view of an embodiment of the present invention. Referring to FIG. 9, the device can include a winding vent, a vent opening, and metal pads that are on the opposite side of the TSVs, allowing for electrical connections to be made to external circuitry. The bottom side also includes a cavity that would be beneath the diaphragm and a device contact layer as well as a thermal oxide.

Figure 10:
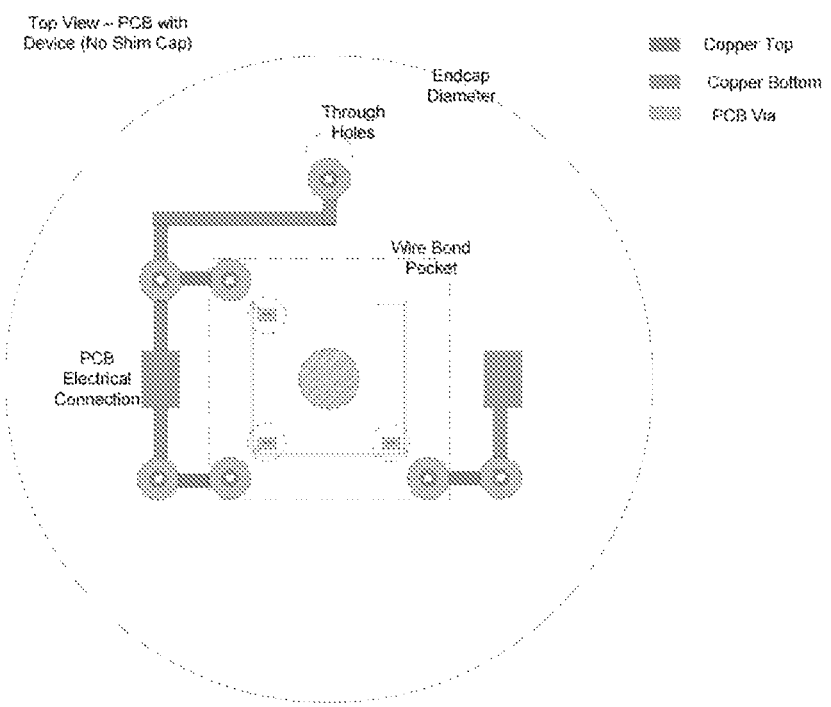
FIG. 10 is a topside view of an embodiment of the present invention.
Figure 11:
FIG. 11 is a topside view of an endcap assembly according to an embodiment of the present invention.

FIG. 10 is a topside view of an embodiment of the present invention. FIG. 10 shows a PCB electrical connection, a wire bond pocket, through holes, a circular diaphragm, and the endcap diameter. The electrical connections can be made of, for example, copper. FIG. 11 is a topside view of an endcap assembly according to an embodiment of the present invention.

Figure 12:
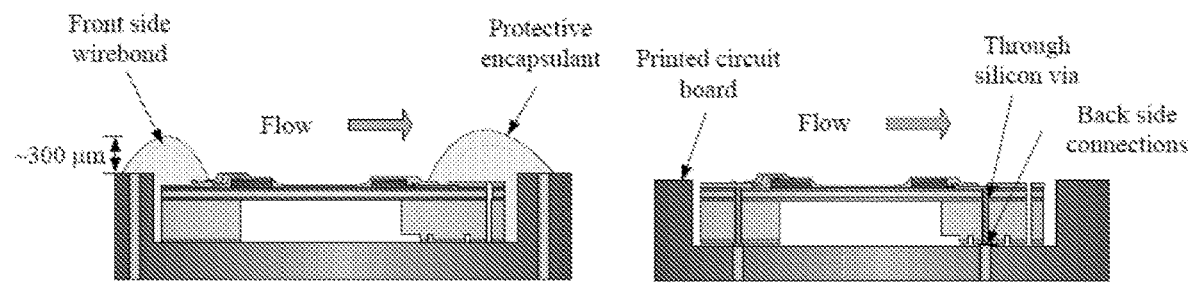
FIG. 12 is a comparison of the surface smoothness of an MEMS microphone with front-side wire bonds and through silicon vias.

MEMS devices with backside contacts can eliminate the issues of wire bonds through the use of through-silicon vias (TSVs) as shown in FIG. 12. The sensing element on the front side of the device thus has a path to the back side where connections to external circuitry can be made. Microphones of the present invention can have a wide audio range bandwidth (20 Hz-20 kHz), a low noise floor of <48 dB SPL, a linear response up to 172 dB, and the packaged sensor flushness can be within 12.5 µm.

Figure 13:
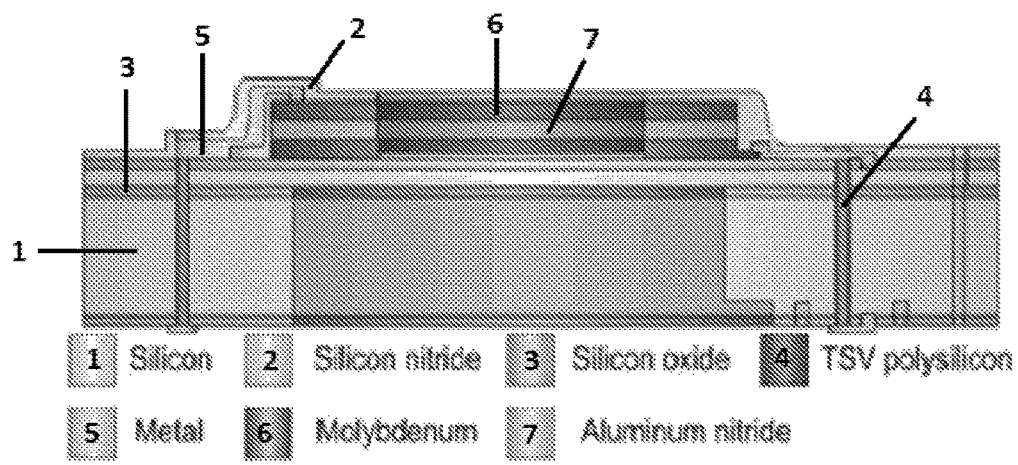
FIG. 13 is a cross-sectional view of a microphone structure according to an embodiment of the present invention.

A microphone of the present invention can consist of a circular diaphragm composed of the device layer of a silicon-on-insulator (SOI) wafer and an annular ring of piezoelectric film stack situated on the outer high stress/ strain region of the diaphragm near its edge. The piezoelectric film stack that makes up the annular ring can include a set of electrodes (molybdenum) and the piezoelectric material (aluminum nitride). The entire front surface of the sensor can have a passivation layer to repel moisture, and the device can be front side vented to allow for pressure equilibration. A photograph of a sensor according to an embodiment of the present invention and a representative cross section are shown in FIGS. 7 and 13, respectively. When an incident acoustic wave deflects the diaphragm, the strain in the piezoelectric layer produces a proportional output voltage across the material, resulting in the microphone output.

Figure 14:
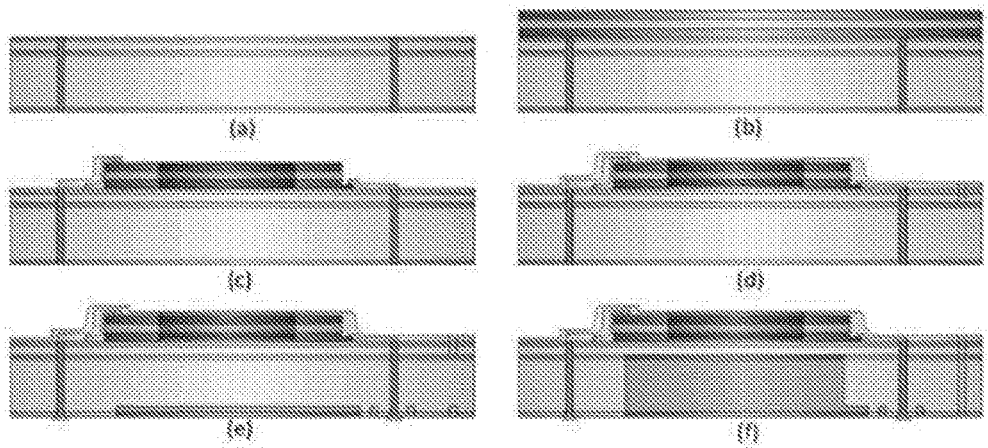
FIGS. 14(a) to 14(f) are schematic views of fabrication steps according to an embodiment of the present invention.

A method of fabrication according to an embodiment of the present invention is outlined in FIG. 14. Fabrication can begin with the initial SOI substrate with polysilicon TSVs (FIG. 14*a*), and the deposition of the piezoelectric film stack (FIG. 14*b*). The piezoelectric annular ring can be defined and a small silicon dioxide feature can be patterned to provide electrical isolation between the two electrodes and prevent an electrical short when the front side metal contacts are made. A ground strap can then be etched to the device layer, and the front side metal deposited and patterned to connect each electrode to its TSV (FIG. 14*c*). Then, a hydrophobic silicon nitride layer can be deposited to repel moisture, and the front side vent opening patterned. The nitride layer can then be etched to expose the metal pads, and allow for front-side probing (FIG. 14d).

Backside processing can follow, in which a ground strap is etched to the handle layer, and the backside metal contacts are formed. Then, the winding vent channel can be defined (FIG. 14e). Finally, a deep reactive ion etch process can be used to form the cavity and the buried oxide layer can be removed (FIG. 14f). The resulting sensors can be diced into their final size (e.g., 2 mm×2 mm) using a laser dicing method. The final sensor package can include two main components. The "endcap" assembly is the developed flush mount microphone package and the laboratory test assembly provides the power and supporting structure necessary for calibration of the sensors.

Figure 15:
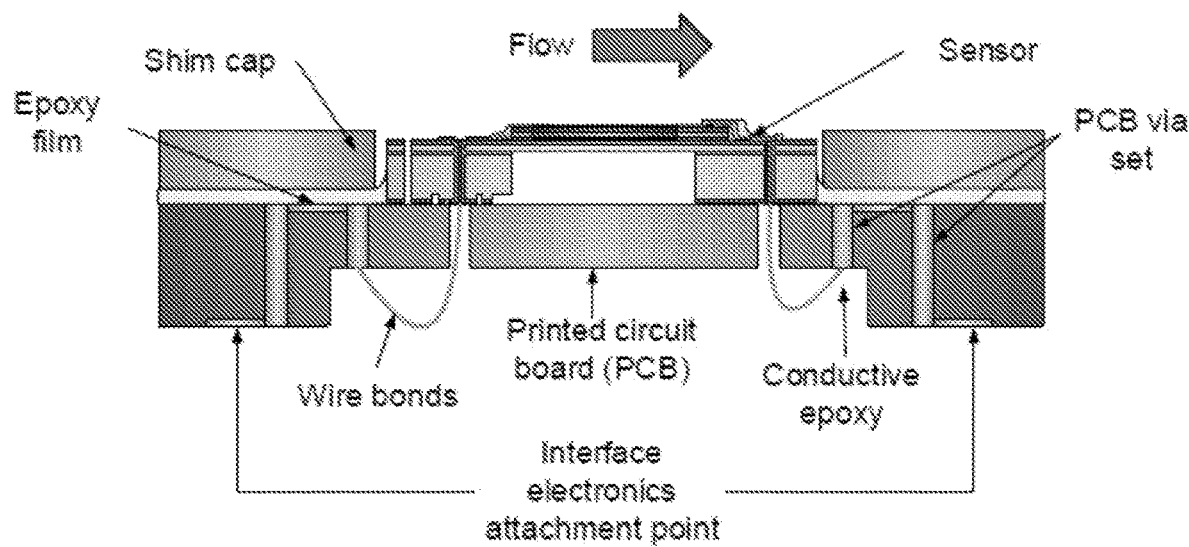
FIG. 15 is a cross-sectional view of an endcap assembly for a flush-mount sensor package according to an embodiment of the present invention.

The endcap assembly consists of the sensor die, a circular shim cap and a circular printed circuit board (PCB) substrate as shown in FIG. 15. The sensor and shim cap are attached to the PCB using an epoxy film specifically designed for substrates with mismatched coefficients of thermal expansion. The epoxy film can also be used to seal the back cavity of the sensor by encompassing the edges of the die, thereby preventing unwanted leakage paths that would reduce the low-frequency response of the sensor. Electrical connections to the device are made from the sensor to the vias contained in a pocket on the backside of the PCB for protection.

The assembly process for the endcap can be as follows. First, the sensor and shim cap are placed on the flip chip bonder stage. The epoxy film can then be seated onto the shim cap, and can be self-aligned to the sensor. A flip chip bonder can be used to align and place the PCB on the sensor/shim cap combination, and the epoxy film can be cured in place using a heated stage. During the heat cure process, the flip chip bonder can apply pressure to the PCB, which pushes down on the epoxy film to encase the sensor around its perimeter.

Figure 16:
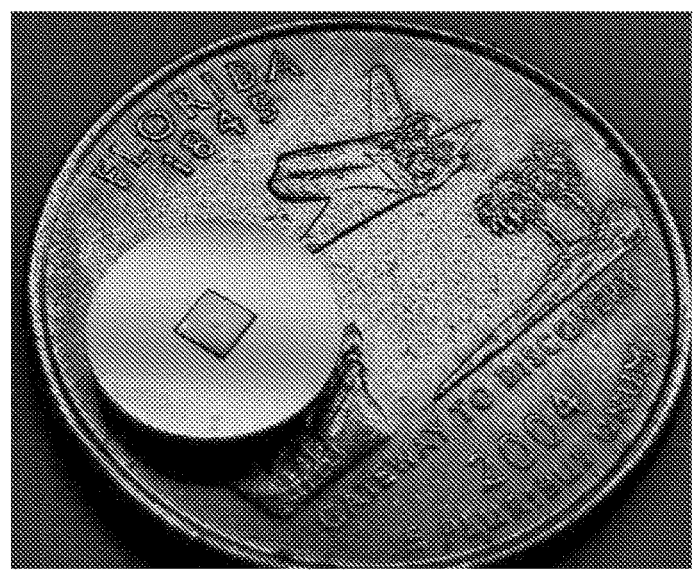
FIG. 16 is a photograph of a flush-mount sensor package with an MEMS piezoelectric microphone according to an embodiment of the present invention.

The stage of the flip chip bonder ensures that the top surface of the sensor and shim cap remain at the same height to establish a hydraulically smooth front surface. Once heat cured, wire bonds can be assembled from the back side of the sensor to the vias in the pocket of the endcap. The ball bond to the metal pads of the sensor is generally straightforward, but the wedge bond to the milled down vias can be problematic. If the first attempt is unsuccessful, it may be difficult to remove the ball bond from the small drill holes through the PCB. Therefore, a room temperature cured silver epoxy can be used to attach the tails of the wire bond if necessary. A photograph of an assembled endcap package is shown in FIG. 16.

Figure 17:
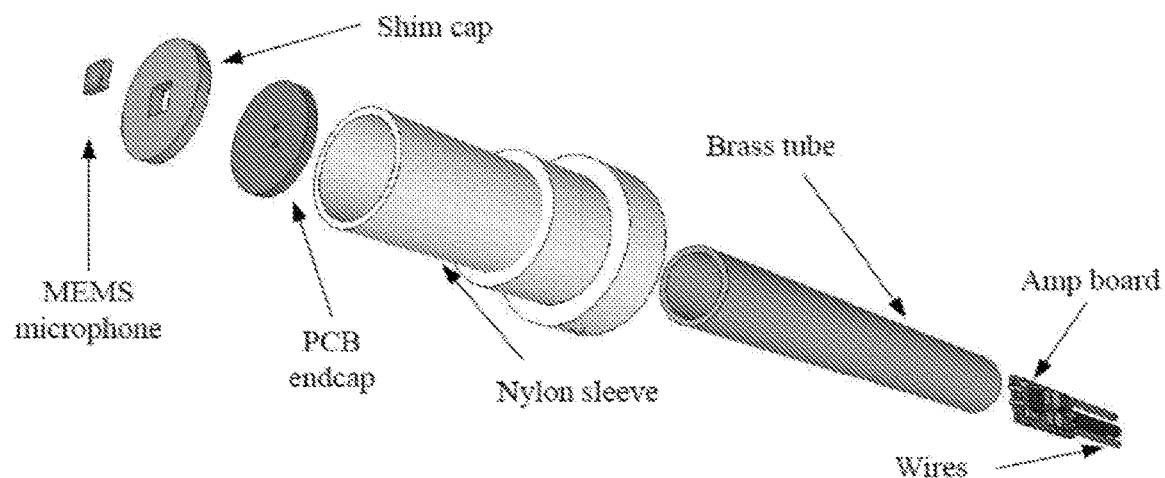
FIG. 17 is an exploded view of a fully assembled laboratory test package showing an endcap assembly, brass tube and interface circuitry.

The endcap assembly can then be mounted onto the laboratory test assembly that provides the supporting structure used to calibrate the sensors, shown in FIG. 17, and is designed to fit into standard test fixtures. The endcap is secured to the end of a brass tube that houses an additional circuit board with a buffer amplifier and power supply filter capacitors. Wire connections that transfer the sensor output and supply power to the amplifier emerge from the back side of the brass tube and are stress relieved using heat shrink tubing. Connections from the sensor to the amplifier boards are made using a short length of wire via soldering and, finally, an outer nylon sleeve is fixed on the assembled tube to ensure mounting flushness and to provide electrical isolation from the test fixtures.

Figure 28:
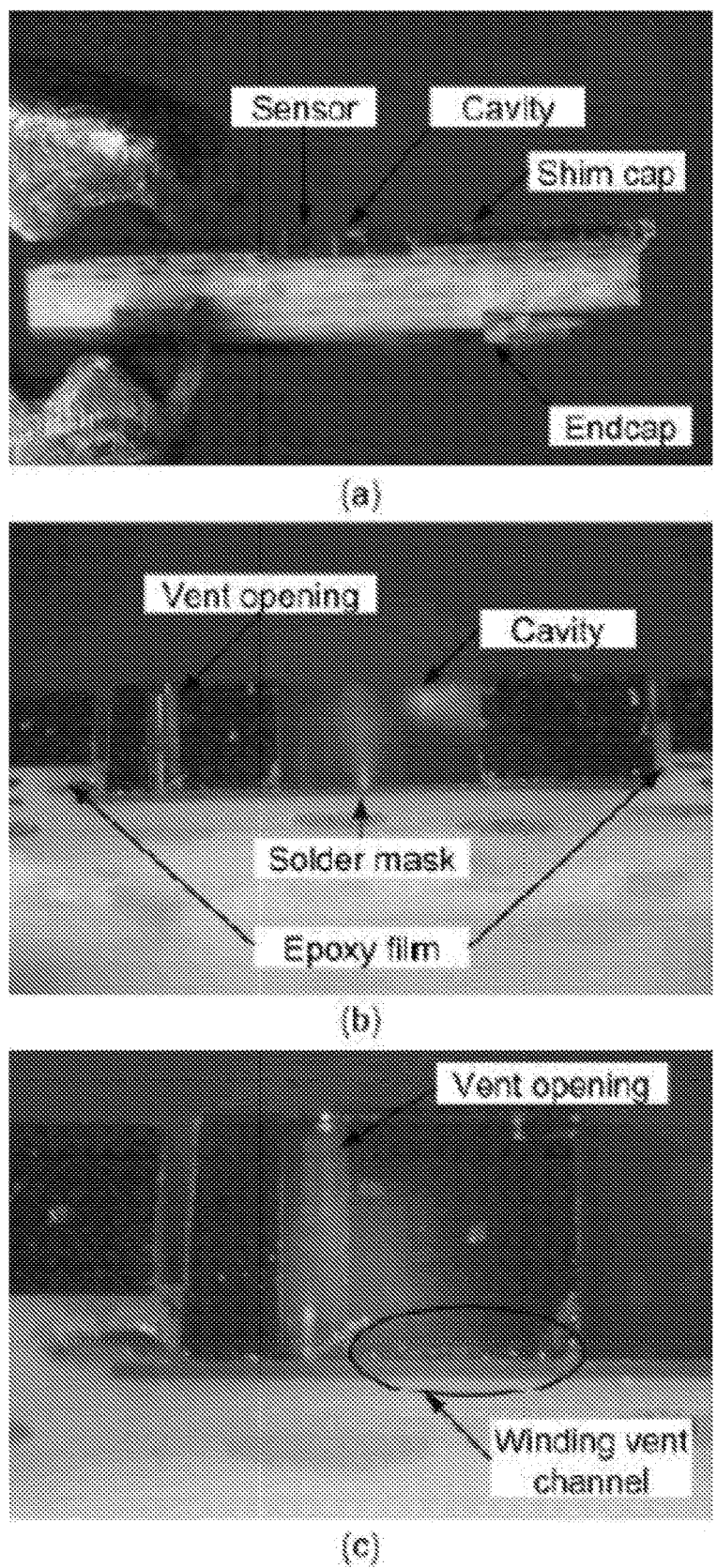
FIG. 28A shows an image of a cross-section of an endcap sensor package according to an embodiment of the present invention.
FIG. 28B shows a zoomed-in image of a cross-section of an endcap sensor package according to an embodiment of the present invention.
FIG. 28C shows a zoomed-in image of a side of a cutout of an endcap sensor package according to an embodiment of the present invention, showing a winding vent channel and mechanical contact with an endcap solder mask material.

FIG. 28A shows an image of a cross-section of an endcap sensor package, FIG. 28B shows a zoomed-in image of a cross-section of the endcap sensor package, and FIG. 28C shows a zoomed-in image of a side of a cutout of the endcap sensor package.

In many embodiments, a sensor package as described herein can have a total thickness (measured in a vertical direction—a direction perpendicular to the upper surface of the shim cap) in a range of from 100 µm to 10 mm, inclusive of the endpoints. A total thickness of the sensor package can be in any subrange within the range of 100 µm to 10 mm. For example, in certain embodiments, a total thickness of the sensor package can be in a range of from 0.5 mm to 2 mm, inclusive of the endpoints, or any subrange therewithin.

The subject invention includes, but is not limited to, the following exemplified Embodiments.

Embodiment 1. A sensor package, comprising:
a substrate;
a sensor disposed (e.g., attached) on a front side of the substrate;
a wire bond coupled to the sensor, passing through the substrate, and not substantially protruding above the surface of the sensor.

Embodiment 2. The sensor package according to Embodiment 1, further comprising a shim cap on the substrate, positioned around the sensor, and flush (or substantially flush) with the sensor.

Embodiment 3. The sensor package according to any of Embodiments 1 to 2, further comprising a first via coupled to the wire bond.

Embodiment 4. The sensor package according to any of Embodiments 1 to 3, further comprising a second via that is coupled to the first via, and an external connection suitable for connecting to external circuitry.

Embodiment 5. The sensor package according to any Embodiments 1 to 4, further comprising a protective encapsulant that surrounds (or substantially surrounds) the wire bond.

Embodiment 6. The sensor package according to any of Embodiments 1 to 5, further comprising an epoxy film that connects the sensor and the shim cap to the substrate (the epoxy film can be provided underneath and/or at a side of the sensor).

Embodiment 7. The sensor package according to any of Embodiments 1 to 6, wherein a surface roughness across the top of the sensor package is less than or equal to 130 µm.

Embodiment 8. The sensor package according to any of Embodiments 1 to 7, wherein a surface roughness across the top of the sensor package is less than or equal to 100 µm.

Embodiment 9. The sensor package according to any of Embodiments 1 to 8, wherein a surface roughness across the top of the sensor package is less than or equal to 50 µm.

Embodiment 10. The sensor package according to any of Embodiments 1 to 9, wherein a surface roughness across the top of the sensor package is less than or equal to 25 µm.

Embodiment 11. The sensor package according to any of Embodiments 1 to 10, wherein a surface roughness across the top of the sensor package is less than or equal to 10 µm.

Embodiment 12. The sensor package according to any of Embodiments 1 to 11, further comprising a sensor vent.

Embodiment 13. The sensor package according to any of Embodiments 1 to 12, wherein the sensor package does not require a bias voltage.

Embodiment 14. The sensor package according to any of Embodiments 1 to 13, wherein the sensor package requires 10 mA or less current.

Embodiment 15. The sensor package according to any of Embodiments 1 to 14, wherein the sensor has a transducer that is optical, or capacitive, or piezoresistive, or piezoelectric.

Embodiment 16. The sensor package according to any of Embodiments 2 to 15, wherein the sensor and the shim cap are monolithically formed.

Embodiment 17. The sensor package according to any of Embodiments 1 to 16, further comprising any limitation, or any combination of limitations, of Embodiments 101 to 116, Embodiments 201 to 205, and Embodiments 301 to 325.

Embodiment 101. A sensor package, comprising:
a substrate;
a sensor disposed (e.g., attached) on a front side of the substrate;
a means for electrically coupling the sensor to a back or sides of the substrate without protruding above a top of the sensor (or substantially protruding above a top of the sensor).

Embodiment 102. The sensor package according to Embodiment 101, wherein the means for electrically coupling the sensor to the back or sides of the substrate includes a wire bond that is coupled to the sensor.

Embodiment 103. The sensor package according to any of Embodiments 101 to 102, further comprising a shim cap that is placed on the substrate, around the sensor, and is relatively flush with the top side of the sensor.

Embodiment 104. The sensor package according to any of Embodiments 101 to 103, wherein the wire bond passes through the substrate or shim cap.

Embodiment 105. The sensor package according to any of Embodiments 101 to 104, wherein the wire bond is coupled to a via in the substrate, and the via passes through the substrate.

Embodiment 106. The sensor package according to any of Embodiments 101 to 105, further comprising a protective encapsulant that surrounds the wire bond.

Embodiment 107. The sensor package according to any of Embodiments 101 to 106, further comprising a pocket in the front side of the substrate; wherein the sensor is located in the pocket; and wherein the means for electrically coupling the sensor to the back or sides of the substrate includes a wire bond that is coupled to the sensor.

Embodiment 108. The sensor package according to any of Embodiments 101 to 107, wherein a surface roughness across the top of the sensor package is less than or equal to 30 μm.

Embodiment 109. The sensor package according to any of Embodiments 101 to 108, wherein a surface roughness across the top of the sensor package is less than or equal to 100 μm.

Embodiment 110. The sensor package according to any of Embodiments 101 to 109, wherein a surface roughness across the top of the sensor package is less than or equal to 50 μm.

Embodiment 111. The sensor package according to any of Embodiments 101 to 110, wherein a surface roughness across the top of the sensor package is less than or equal to 10 μm.

Embodiment 112. The sensor package according to any of Embodiments 101 to 111, further comprising a sensor vent.

Embodiment 113. The sensor package according to any of Embodiments 101 to 112, wherein the sensor package does not require a bias voltage.

Embodiment 114. The sensor package according to any of Embodiments 101 to 113, wherein the sensor package requires 10 mA or less current.

Embodiment 115. The sensor package according to any of Embodiments 101 to 114, wherein the sensor has a transducer that is optical, or capacitive, or piezoresistive, or piezoelectric.

Embodiment 116. The sensor package according to any of Embodiments 103 to 115, wherein the sensor and the shim cap are monolithically formed.

Embodiment 117. The sensor package according to any of Embodiments 101 to 116, further comprising any limitation, or any combination of limitations, of Embodiments 1 to 16, Embodiments 201 to 205, and Embodiments 301 to 325.

Embodiment 201. A sensor package, comprising:
a substrate having a pocket formed on a front side of the substrate;
a sensor mounted in the pocket of the substrate and sitting relatively flush with sides of the substrate; and
a means for electrically coupling the sensor to the back or sides of the substrate without protruding above a top of the sensor package (or substantially protruding above a top of the sensor package).

Embodiment 202. The sensor package according to Embodiment 201, wherein the means for electrically coupling the sensor to the back or sides of the substrate includes a wire bond or a via.

Embodiment 203. The sensor package of any of Embodiments 201 to 202, wherein the sensor is a pressure sensor, a dynamic pressure sensor, a microphone, or a shear stress sensor.

Embodiment 204. The sensor package according to any of Embodiments 201 to 203, wherein a surface roughness across the top of the sensor package is less than 30 μm.

Embodiment 205. The sensor package according to any of Embodiments 201 to 204, further comprising a sensor vent.

Embodiment 206. The sensor package according to any of Embodiments 201 to 205, further comprising any limitation, or any combination of limitations, of Embodiments 1 to 15, Embodiments 101 to 116, and Embodiments 301 to 324.

Embodiment 301. A sensor package, comprising:
a diaphragm;
a perimeter of piezoelectric material (or a piezo electric film stack, e.g., made of layers of aluminum nitride) coupled to the diaphragm and suitable for producing voltages when the diaphragm moves or vibrates;
a substrate (e.g., a PCB) connected to the perimeter of piezoelectric material; and
a means for electrically coupling the sensor to the back or sides of the substrate without protruding above a top of the sensor package (or substantially protruding above a top of the sensor package).

Embodiment 302. The sensor package according to Embodiment 301, wherein the diaphragm is round (or circular) and the perimeter of piezoelectric material is circular and on or near the outside perimeter of the diagram.

Embodiment 303. The sensor package according to any of Embodiments 301 to 302, wherein the sensor package has a passivation layer (e.g., silicon nitride, or other protective film such as a polymer film) on its front surface that repels water and other debris/contaminants.

Embodiment 304. The sensor package according to any of Embodiments 301 to 303, wherein the diaphragm has a thickness below 30 μm, or below 20 μm, or below 10 μm, or from 4 μm to 15 μm (inclusive), or from 4 μm to 10 μm (inclusive), or from 5 μm to 8 μm (inclusive).

Embodiment 305. The sensor package according to any of Embodiments 301 to 304, wherein the piezo electric film stack has a thickness between 85 μm and 100 μm (inclusive), or between 70 μm and 115 μm (inclusive), or between 60 μm and 125 μm (inclusive).

Embodiment 306. The sensor package according to any of Embodiments 301 to 305, wherein the piezo electric film stack includes layers (e.g., AlN layers) having a thickness between 0.5 μm and 3.0 μm (inclusive), or between 0.5 μm and 2.0 μm (inclusive), or between 0.5 μm and 1.5 μm (inclusive).

Embodiment 307. The sensor package according to any of Embodiments 301 to 306, further comprising electrodes (e.g., molybdenum electrodes) functionally incorporated with the piezoelectric material.

Embodiment 308. The sensor package according to any of Embodiments 301 to 307, wherein a diameter of the diaphragm is between 500 μm and 1500 μm (inclusive), or between 500 μm and 1000 μm (inclusive), or between 600 μm and 900 μm (inclusive), or between 700 μm and 800 μm (inclusive).

Embodiment 309. The sensor package according to any of Embodiments 301 to 308, wherein a surface roughness across the top of the sensor package is less than or equal to 50 μm, or less than or equal to 25 μm, or less than or equal to 10 μm, or between 3 μm and 10 μm (inclusive).

Embodiment 310. The sensor package according to any of Embodiments 301 to 309, wherein the diaphragm is circular (or substantially circular).

Embodiment 311. The sensor package according to any of Embodiments 301 to 310, wherein the piezoelectric ring is circular (or substantially circular).

Embodiment 312. The sensor package according to any of Embodiments 301 to 311, further comprising a shim cap that surrounds the diaphragm and the perimeter of piezoelectric material and is seated on the substrate (e.g., applied using an epoxy preferably selected for materials having mismatched coefficients of thermal expansion).

Embodiment 313. The sensor package according to any of Embodiments 301 to 312, wherein the means for electrically coupling the sensor to the back or sides of the substrate includes wire bonds (e.g., wire bonds that pass through the substrate).

Embodiment 314. The sensor package according to any of Embodiments 301 to 313, further comprising a first TSV coupled to the sensor (e.g. using the wire bonds) and passing through the substrate.

Embodiment 315. The sensor package according to any of Embodiments 301 to 314, further comprising a second TSV coupled to the first TSV and passing through the substrate.

Embodiment 316. The sensor package according to any of Embodiments 301 to 315, further comprising electrical connections for the sensor package that are on the back of the substrate (or on the sides of the substrate, and connected to the wire bonds, or first TSV, or second TSV).

Embodiment 317. The sensor package according to any of Embodiments 301 to 316, further comprising a protective encapsulant (e.g., an epoxy) that covers the wire bonds.

Embodiment 318. The sensor package according to any of Embodiments 301 to 317, wherein an epoxy film seals the sensor cavity (e.g. connected it to the shim caps and the substrate).

Embodiment 319. The sensor package according to any of Embodiments 301 to 318, further comprising a sensor vent (e.g., a winding sensor vent).

Embodiment 320. The sensor package according to any of Embodiments 301 to 319, wherein the sensor package does not require a bias voltage.

Embodiment 321. The sensor package according to any of Embodiments 301 to 320, wherein the sensor package requires 10 mA or less current to operate.

Embodiment 322. The sensor package according to any of Embodiments 301 to 321, wherein the resonance frequency of the sensor is between 100 kHz and 300 kHz (inclusive), or between 150 kHz and 250 kHz (inclusive), or between 160 kHz and 200 kHz (inclusive), or between 175 kHz and 195 kHz (inclusive), Embodiment 323. The sensor package according to any of Embodiments 301 to 322, further comprising a room temperature cured silver epoxy for attaching the wire bonds.

Embodiment 324. The sensor package according to any of Embodiments 301 to 323, wherein the sensitivity of the sensor package changes less than 10% after multiple temperature cyclings from 125° C. to −55° C., or changes less than 5.0% after multiple temperature cycling from 125° C. to −55° C.

Embodiment 325. The sensor package according to any of Embodiments 301 to 324, wherein the diaphragm is hermetically sealed (i.e., there is no vent).

Embodiment 326. The sensor package according to any of Embodiments 312 to 325, wherein the sensor and the shim cap are monolithically formed.

Embodiment 327. The sensor package according to any of Embodiments 301 to 326, further comprising any limitation, or any combination of limitations, of Embodiments 1 to 16, Embodiments 101 to 116, and Embodiments 201 to 205.

Embodiment 401. A method of fabricating a sensor package, the method comprising:
providing a substrate;
attaching a sensor (e.g., including a diaphragm and a piezoelectric perimeter) to a front side of the substrate; and
coupling a wire bond to the sensor such that the wire bond does not protrude above a top surface of the sensor (or substantially protrude above a top surface of the sensor) (or is attached to the backside of the sensor).

Embodiment 402. The method of fabricating a sensor package according to Embodiment 401, further comprising attaching a shim cap to the front side of the substrate such that the shim cap is relatively flush with the top surface of the sensor.

Embodiment 403. The method of fabricating a sensor package according to any of Embodiments 401 to 402 further comprising, before attaching the sensor to the front side of the substrate, milling out a pocket in the front side of the substrate such that the sensor resides in the pocket and is relatively flush with sides of the pocket.

Embodiment 404. The method of fabricating a sensor package according to any of Embodiments 401 to 403, wherein the sensor and the shim cap are placed on the substrate in unison using heat tape and a flip-chip bonder.

Embodiment 405. The method of fabricating a sensor package according to any of Embodiments 401 to 404, wherein the sensor and the shim cap are attached to the substrate using an epoxy film (the epoxy film can be provided underneath and/or at a side of the sensor).

Embodiment 406. The method of fabricating a sensor package according to any of Embodiments 401 to 405, further comprising providing a protective encapsulant that surrounds the wire bond.

Embodiment 407. The method of fabricating a sensor package according to any of Embodiments 401 to 406, further comprising providing one or more TSVs in the substrate and attaching the sensor to the TSVs (e.g., using the wire bonds).

Embodiment 408. The method of fabricating a sensor package according to any of Embodiments 401 to 407, further comprising providing one or more TSVs in the substrate and attaching the sensor to the TSVs (e.g., using the wire bonds).

Embodiment 409. The method of fabricating a sensor package according to any of Embodiments 401 to 408, further comprising providing one or more TSVs in the substrate and attaching the sensor to the TSVs (e.g., using the wire bonds).

Embodiment 501. A sensor package, comprising:
a substrate; and
a sensor disposed on a front side of the substrate and electrically and mechanically connected to the substrate, wherein the electrical and mechanical connections of the sensor to the substrate are decoupled.

Embodiment 502. The sensor package according to Embodiment 501, further comprising a shim cap on the substrate, positioned around the sensor, and flush (or substantially flush) with the sensor.

Embodiment 503. The sensor package according to any of Embodiments 501 to 502, further comprising a first via coupled to the sensor.

Embodiment 504. The sensor package according to any of Embodiments 501 to 503, further comprising a second via that is coupled to the first via, and an external connection suitable for connecting to external circuitry.

Embodiment 505. The sensor package according to any Embodiments 501 to 504, further comprising a protective encapsulant disposed between the sensor and the substrate.

Embodiment 506. The sensor package according to any of Embodiments 501 to 505, further comprising an epoxy film that connects the sensor and the shim cap to the substrate (the epoxy film can be provided underneath and/or at a side of the sensor).

Embodiment 507. The sensor package according to any of Embodiments 501 to 506, wherein a surface roughness across the top of the sensor package is less than or equal to 130 µm.

Embodiment 508. The sensor package according to any of Embodiments 501 to 507, wherein a surface roughness across the top of the sensor package is less than or equal to 100 µm.

Embodiment 509. The sensor package according to any of Embodiments 501 to 508, wherein a surface roughness across the top of the sensor package is less than or equal to 50 µm.

Embodiment 510. The sensor package according to any of Embodiments 501 to 509, wherein a surface roughness across the top of the sensor package is less than or equal to 25 µm.

Embodiment 511. The sensor package according to any of Embodiments 501 to 510, wherein a surface roughness across the top of the sensor package is less than or equal to 10 µm.

Embodiment 512. The sensor package according to any of Embodiments 501 to 511, further comprising a sensor vent.

Embodiment 513. The sensor package according to any of Embodiments 501 to 512, wherein the sensor package does not require a bias voltage.

Embodiment 514. The sensor package according to any of Embodiments 501 to 513, wherein the sensor package requires 10 mA or less current.

Embodiment 515. The sensor package according to any of Embodiments 501 to 514, wherein the sensor has a transducer that is optical, or capacitive, or piezoresistive, or piezoelectric.

Embodiment 516. The sensor package according to any of Embodiments 502 to 515, wherein the sensor and the shim cap are monolithically formed.

Embodiment 601. The sensor package according to any of Embodiments 1-17, 101-117, and 501-516, wherein the sensor is a pressure sensor, a dynamic pressure sensor, a microphone, or a shear stress sensor.

Embodiment 602. The sensor package according to any of Embodiments 1-17, 101-117, 301-326, 501-516, and 601, wherein the sensor is a MEMS sensor.

Embodiment 603. The sensor package according to any of Embodiments 1-17, 101-117, 301-326, 501-516, 601, and 602, wherein the sensor has an upper surface that is flat or mostly flat or substantially flat.

Embodiment 701. The method according to any of Embodiments 201, 202, and 204-206, wherein the sensor is a pressure sensor, a dynamic pressure sensor, a microphone, or a shear stress sensor.

Embodiment 702. The method according to any of Embodiments 201-206, 401-409, and 701, wherein the sensor is a MEMS sensor.

Embodiment 703. The method according to any of Embodiments 201-206, 401-409, 701, and 702, wherein the sensor has an upper surface that is flat or mostly flat or substantially flat.

Embodiment 801. The sensor package according to any of Embodiments 1-17, 101-117, 301-326, 501-516, and 601-603, or the method according to any of Embodiments 201-206, 401-409, and 701-703, wherein a total thickness of the sensor package (measured in a vertical direction—a direction perpendicular to the upper surface of the shim cap) is in a range of from 100 µm to 10 mm.

Embodiment 802. The sensor package or method according to Embodiment 801, wherein the total thickness of the sensor package is in a range of from 0.5 mm to 2 mm.

Several of the above Embodiments provide limitations listed in the alternative (e.g., using the word "or"). These Embodiments are intended to provide direct support for each of the alternatively listed limitations individually.

Materials and Methods

The sensor package component materials and the types and sizes of sensors listed herein are not intended to limit the scope of the invention. If a claim includes a component material or sensor limitation, it is only intended to apply to that claim, not to all the embodiments of the invention. However, some materials may be particularly well suited for use in the embodiments of the present invention. For example, shim caps can be made of a variety of materials including plastics, silicon, and metal, but a hard material is typically preferable due to potential warping that can occur during a heat cure step, which may increase surface roughness. Wire bonds can be made of a variety of materials including gold and other metals. The substrate can be a silicon-on-insulator wafer, a printed circuit board, or another type of substrate. The TSVs (or other types of vias) can be made of doped polysilicon, copper, other metals, or other materials. The diaphragm for the sensor can be made of a silicon-on-insulator wafer, sapphire for high temperature applications, as well as a variety of other materials. The protective encapsulant can be made of RTV silicone, but other types of encapsulants can be used (e.g., UV cure epoxies, etc.). Material considerations should also be made considering the applications of the sensor package and the operating conditions.

As an example of specific materials that can be utilized in embodiments, FIG. 13 shows the use of silicon 1, silicon nitride 2, silicon oxide 3, TSV polysilicon 4, metal 5, molybdenum 6, and aluminum nitride 7.

The dimensions discussed throughout the application are also not intended to limit the embodiments or the scope of the invention. If a claim includes a dimensional limitation, it is only intended to apply to that claim, not to all the embodiments of the invention. The embodiments of the present invention can be applied to a wide variety of sensors that operate in a multitude of different environments and for different applications (e.g., arrays, single mounts, etc.). Therefore, it will often be necessary to adjust dimensions based on these factors.

Examples of dimensions that can be applied to the embodiments of the invention are as follows. A microphone sensor can be roughly 2 mm by 2 mm and have a thickness of approximately 400 μm. Shear stress sensors can be about 2 mm by 4 mm, but vary depending on performance specifications. The diameter of the sensor diaphragms can range from 250 μm to 1.2 mm in diameter. A shim cap can be approximately 9 mm.

A greater understanding of the present invention and of its many advantages may be had from the following examples, given by way of illustration. The following examples are illustrative of some of the methods, applications, embodiments and variants of the present invention. They are, of course, not to be considered as limiting the invention. Numerous changes and modifications can be made with respect to the invention.

Example 1

Experiments were conducted to prove the concepts of the present invention and demonstrate prototype performance. The measurements taken include surface roughness of the endcap assembly, resonant frequency, frequency response, linearity and noise floor.

Figure 18:
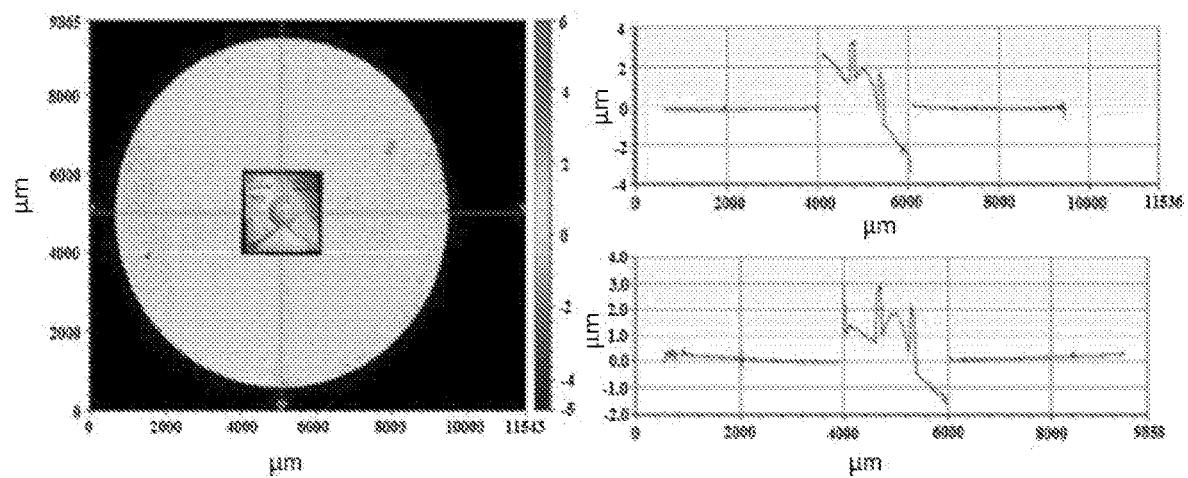
FIG. 18 is a scanning white light interferometry (SWLI) measurement of an assembled endcap structure of the present invention (left), including graphs of its top view X-profile (top right) and Y-profile (bottom right).

The surface topography of an assembled endcap package was quantified using a Bruker Contour GT-1 scanning white light interferometer (SWLI). A complete scan of the entire endcap assembly was made by stitching multiple measurements together, and the results are shown in FIG. 18. An overall flushness of ~6 μm across the entire package was achieved with a sensor to shim cap step height of ~3 μm.

Figure 19:
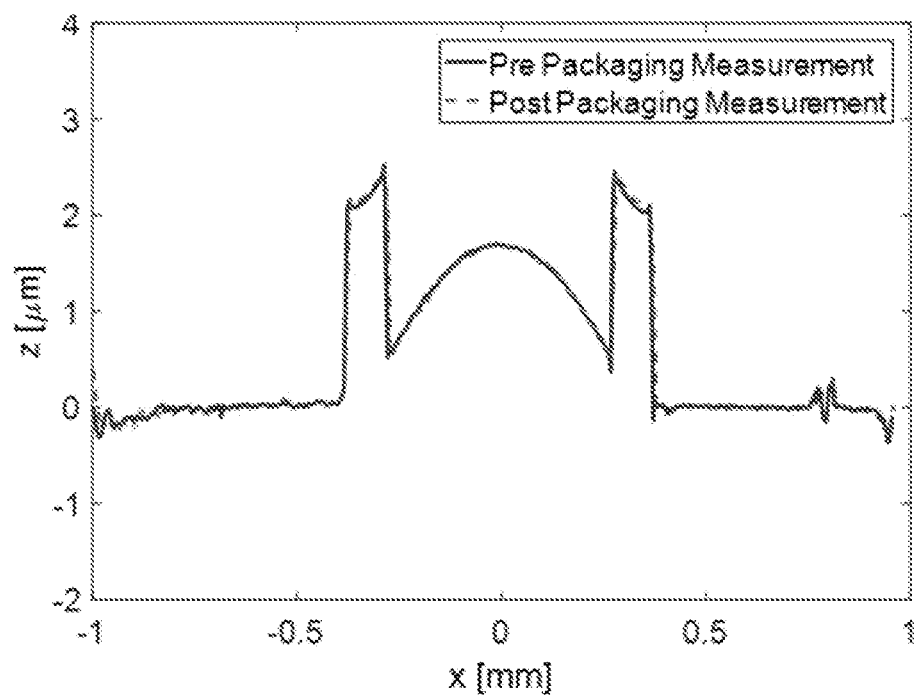
FIG. 19 is a graph of pre and post packaging SWLI measurements of diaphragm deflection.

Measurements made both before and after packaging of the static deflection of the diaphragm provide an indication of the impact of the packaging stresses on the sensor performance, and the results are shown in FIG. 19. The negligible change between the two measurements indicates minimal impact of packaging stresses on the sensor.

The response of the sensor under an electrical chirp excitation was measured using a Polytec scanning laser vibrometer system. The resonant frequency of 187 kHz before packaging compares favorably with the designed value of 178 kHz when accounting for fabrication uncertainties. Additionally, the resonant frequency provides a qualitative measure of the bandwidth of the device in the absence of an explicit high frequency acoustic characterization method. The post-packaged measured resonant frequency of 188 kHz further indicates a minimal shift in the sensor performance due to the packaging process.

The frequency response of the piezoelectric microphone was measured through comparison with a measurement-grade reference microphone in an acoustic plane wave tube (PWT). A PWT is a rigid waveguide designed such that only planar waves propagate below the cutoff frequency, fc (the cutoff frequency of the plane wave tube). This frequency is dependent upon the cross section of the duct and the isentropic speed of sound of the propagation medium. In this manner, two microphones mounted at the same lengthwise location along the duct will see the same pressure, provided that the drive frequency is below the cutoff frequency.

Figure 20:
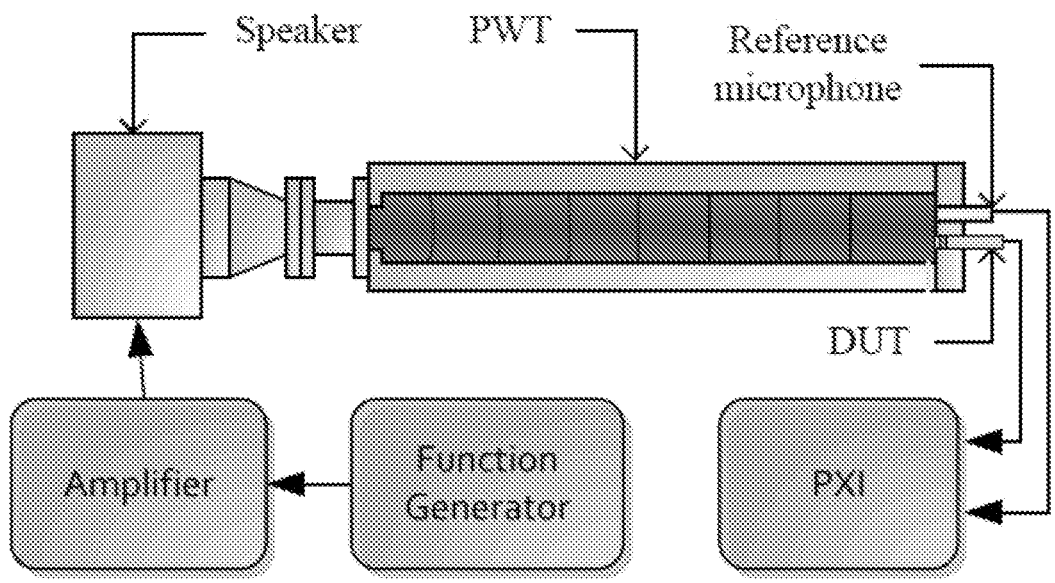
FIG. 20 is an experimental setup for measurement of sensor frequency response.

The experimental setup can be seen in FIG. 20, where the device under test (DUT) and the reference, a Bruel and Kjaer 4138 ⅛-in pressure field microphone, are mounted at the end of the PWT. An Agilent 33220A Function Generator was used to generate the pseudo-random test signal that was sent through a Crown XLS 1500 amplifier before reaching a BMS 4590 compression driver. A National Instruments PXI Data Acquisition system was then used to acquire the data. Measurements were conducted over a 6.4 kHz bandwidth using a 1 Hz bin width and a center frequency of 3.5 kHz. The lower limit of 300 Hz was dictated by the limited speaker performance below that frequency, while the maximum frequency of 6.7 kHz was the cutoff frequency for the PWT in air.

Figure 21:
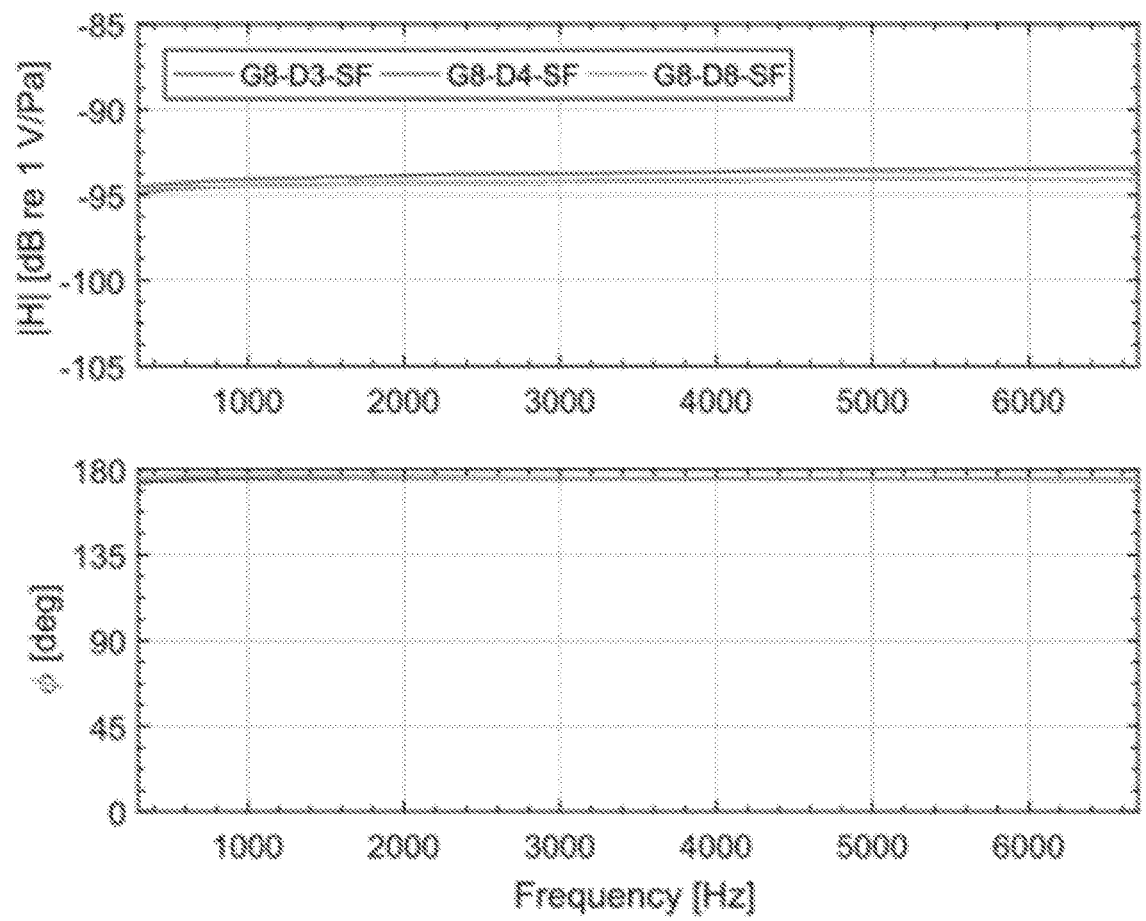
FIG. 21 is a graph of initial frequency response of a first experimental embodiment of the present invention (DUT1).

The frequency response measurement (H) for the selected microphone DUT1 is shown in FIG. 21 in terms of magnitude (|H|) and relative phase (φ). The magnitude was flat to within 2 dB over the measurement range, and the sensitivity taken at 1 kHz was 10.3 μV/Pa (−99.7 dB ref 1 V/Pa). The small dip in the magnitude of the frequency response measurement as well as the relative phase around 3.5 kHz, in addition to the phase roll off, were believed to be an interface circuitry issue.

Material selection for the sensor package can play a large role in sensor performance, especially over time. Most notably, the mismatch in coefficients of thermal expansion (CTE) between the PCB and sensor generate high stresses and strains at the attachment point when rigidly connected, such as with a solder joint. Over time, these stresses can lead to degradation in sensor performance, or even failure.

Figure 22:
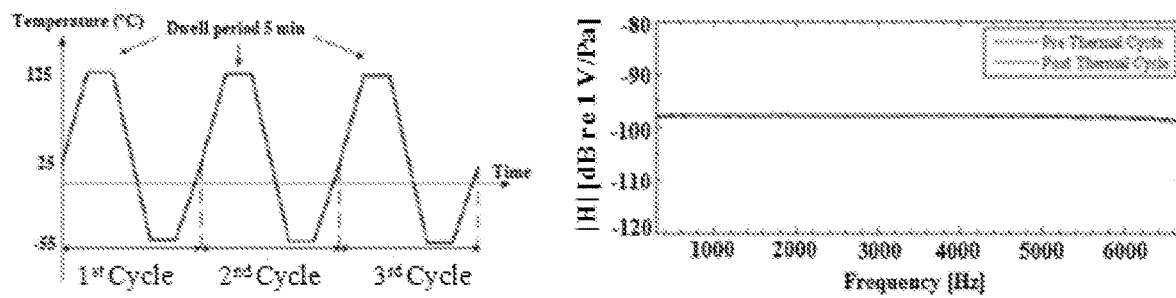
FIG. 22 is an applied thermal cycling profile (left) and a graph of measured sensitivity before and after thermal cycling (right) of a second experimental embodiment of the present invention (DUT2).

The integrity of the developed sensor package in regards to thermal cycling was determined to assess its reliability. Thermal stability was evaluated by cycling the microphone package from room temperature to 125° C., down to −55° C. and back to room temperature multiple times in an Espec ESX-3CA environmental chamber. The frequency response was measured before and after the thermal cycle to compare sensor performance. The applied thermal cycling profile and resulting measurements are shown in FIG. 22 for DUT2. The sensitivity of the device taken at 1 kHz after thermal cycling was 12.6 μV/Pa and is within 4% of the pre-cycling measurement of 13.1 μV/Pa.

The linearity of the MEMS sensor was determined through examination of how the voltage output of the sensor changed with increasing sound pressure level. This was quantified using the total harmonic distortion metric (THD), written in terms of the power spectral density as, $$THD = \sqrt{\frac{\sum_{n=2}^{\infty} G_{mm}(f_n)}{G_{mm}(f_1)}} \times 100\% \quad 1$$

where $f_1$ is the excitation frequency (or first harmonic), $G_{mm}$ is the power spectral density of microphone, and $f_n$ is the nth harmonic.

The same setup used to determine the frequency response of the sensor was used to obtain the data for the total harmonic distortion (THD) calculation. A single tone 1 kHz test signal was used to drive the BMS 4590 compression driver beginning at moderate sound pressure levels and then progressively increasing in 2 dB steps to the upper limits of the speaker, corresponding to approximately 160 dB. A PCB Piezotronics Model 377A51 precision condenser microphone was used as a reference, which is rated to a maximum sound pressure level of 192 dB (3% distortion).

The same measurement settings as the frequency response section were used to collect the output of the DUT and reference microphone at multiple sound pressure levels. The measurement range from 300 Hz to 6.7 kHz allowed the first 6 harmonics to be captured with an excitation frequency of 1 kHz. Using the PWT setup, harmonics higher than 6.7 kHz propagate as higher-order modes and therefore do not contribute to the response of the DUT and reference microphones equally. It is therefore important that these harmonics be negligible in order for the calculation to be valid.

Figure 23:
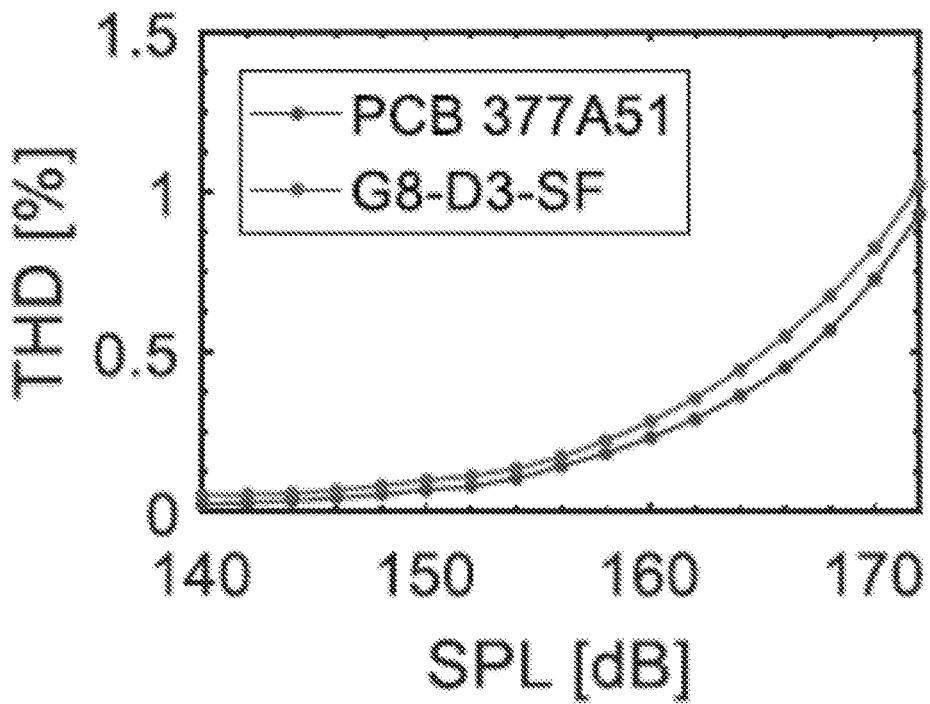
FIG. 23 is a graph of total harmonic distortion (THD) measurements of a first experimental embodiment of the present invention (DUT1).

The THD calculation for DUT1 and the reference microphone is shown in FIG. 23. As can be seen, the large distortion present in the reference microphone at higher sound pressure levels indicates that nonlinearities are present in the measurement environment, where likely contributors are the amplifier, speaker and/or waveguide. As a result, the measurement of the DUT is not a definitive one, although a qualitative analysis can be inferred via comparison with the reference microphone. The resulting calculations of both microphones align fairly well, with a maximum observed difference between the two within 2% THD at the 160 dB test point. This provides reasonable certainty that the 3% distortion limit is above the 160 dB testable range.

The extrinsic noise floor of the packaged sensor was also determined utilizing the same measurement setup depicted in the frequency response section. The intrinsic noise floor of the sensor indicates the best achievable noise characteristics when it is effectively shielded from extrinsic noise sources, such as electromagnetic interference (EMI). However, EMI does contribute to the noise characteristics of the sensor, particularly at 60 Hz and the associated harmonics. As such, the noise floor determined from a typical measurement environment is a better indicator of the achievable noise characteristics of the device, were it to be used as a measurement tool.

Figure 24:
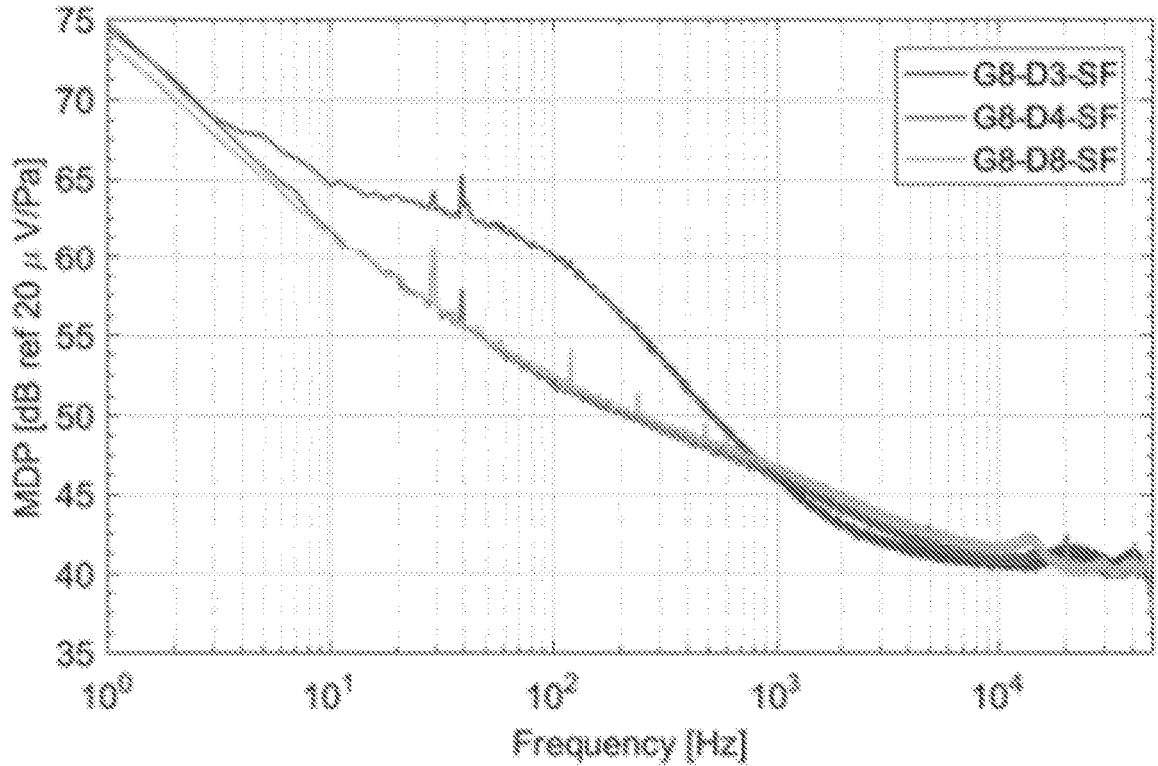
FIG. 24 is a minimum detectable pressure (MDP) spectra graph of a first experimental embodiment of the present invention (DUT1).
Figure 25:
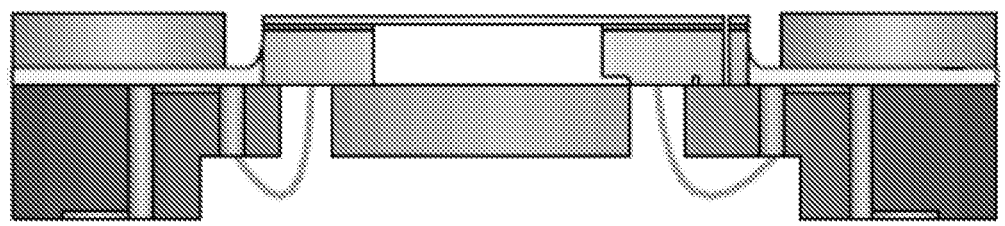
FIG. 25 is a cross-sectional view of a sensor package according to an embodiment of the present invention, including a microphone sensor.
Figure 26:
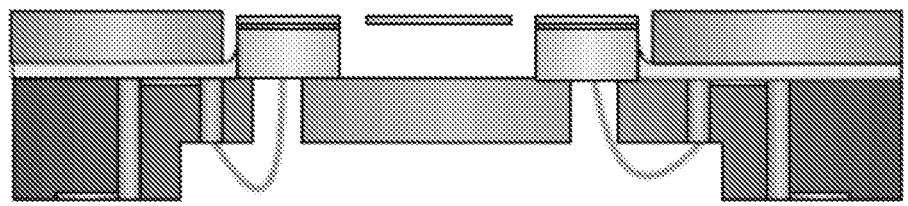
FIG. 26 is a cross-sectional view of a sensor package according to an embodiment of the present invention, including a shear stress sensor.

The same measurement settings were used to collect the output of the DUT and reference microphone with the function generator and amplifier turned off. The corresponding minimum detectable pressure (MDP) spectra for the sensor was then determined from the calculated output noise PSD, $S_o^v$, as $$MDP = 20\log_{10}\left(\frac{\sqrt{S_o^v/|S_m|^2}}{20\mu Pa/Hz^{1/2}}\right) \quad 2$$

where $|Sm|=|Hm(1\text{ kHz})|$ is the flat band sensitivity value previously measured. The MDP spectra for DUT1 is shown in FIG. 24. The resulting noise floor is below the target MDP of 44.6 dB at 1 kHz for the 1 Hz bin width, and below the 48.5 dB target.

It should be understood that the examples and embodiments described herein are for illustrative purposes only and that various modifications or changes in light thereof will be suggested to persons skilled in the art and are to be included within the spirit and purview of this application.

All patents, patent applications, provisional applications, and publications referred to or cited herein (including those in the "References" section, if present) are incorporated by reference in their entirety, including all figures and tables, to the extent they are not inconsistent with the explicit teachings of this specification.

What is claimed is:

1. A sensor package, comprising:
    a substrate;
    a sensor mounted on a front side of the substrate;
    a wire bond coupled to the sensor and passing through the substrate; and
    a shim cap positioned on the substrate and around the sensor,
    wherein the wire bond remains beneath a topside of the shim cap and the sensor.

2. The sensor package according to claim 1, further comprising a first via coupled to the wire bond.

3. The sensor package according to claim 2, further comprising a second via that is coupled to the first via, and an external connection suitable for connecting to external circuitry.

4. The sensor package according to claim 1, further comprising a protective encapsulant that substantially surrounds the wire bond, and wherein the shim cap is relatively flush with the sensor.

5. The sensor package according to claim 1, further comprising an epoxy film that connects the sensor and the shim cap to the substrate.

6. The sensor package according to claim 1, wherein a surface roughness across the top of the sensor package is less than 100 μm.

7. The sensor package according to claim 1, wherein a surface roughness across the top of the sensor package is less than or equal to 30 μm.

8. A method of fabricating a sensor package, the method comprising:
    providing a substrate;
    attaching a sensor to a front side of the substrate;
    coupling a wire bond to the sensor such that the wire bond does not protrude above a top surface of the sensor package; and
    attaching a shim cap to the front side of the substrate such that the shim cap is relatively flush with a top surface of the sensor,
    wherein the sensor and the shim cap are placed on the substrate in unison using heat tape and a flip-chip bonder.

9. The method of fabricating a sensor package according to claim 8, further comprising passing the wire bond through the substrate.

10. The method of fabricating a sensor package according to claim 8, further comprising, before attaching the sensor to the front side of the substrate, milling out a pocket in the front side of the substrate and placing the sensor in the pocket such that it is relatively flush with sides of the pocket.

11. The sensor packing method according to claim 8, wherein the sensor and the shim cap are attached to the substrate using an epoxy film.

* * * * *